US006232845B1

(12) United States Patent
Kingsley et al.

(10) Patent No.: US 6,232,845 B1
(45) Date of Patent: May 15, 2001

(54) CIRCUIT FOR MEASURING SIGNAL DELAYS IN SYNCHRONOUS MEMORY ELEMENTS

(75) Inventors: Christopher H. Kingsley; Trevor J. Bauer, both of San Jose; Robert W. Wells, Cupertino; Robert D. Patrie, Scotts Valley, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/360,350

(22) Filed: Jul. 22, 1999

Related U.S. Application Data

(63) Continuation-in-part of application No. 09/235,419, filed on Jan. 20, 1999, now Pat. No. 6,075,418, which is a continuation-in-part of application No. 09/115,204, filed on Jul. 14, 1998, which is a continuation-in-part of application No. 08/710,465, filed on Sep. 17, 1996, now Pat. No. 5,790,479
(60) Provisional application No. 60/107,765, filed on Nov. 9, 1998.

(51) Int. Cl.[7] .................................................. G11C 29/00
(52) U.S. Cl. ........................... 331/57; 324/617; 324/633; 327/265; 365/201; 368/118; 368/120; 371/21.4
(58) Field of Search ............................. 331/57; 324/617, 324/633; 327/265; 365/201; 368/118, 120; 371/21.4

(56) References Cited

U.S. PATENT DOCUMENTS

| Re. 34,363 | 8/1993 | Freeman | 307/465 |
|---|---|---|---|
| 3,603,746 | 9/1971 | Heick et al. | 179/175.2 |
| 4,510,429 | 4/1985 | Squire | 318/696 |
| 4,792,932 | 12/1988 | Bowhers et al. | 368/113 |
| 4,795,964 | 1/1989 | Mahant-Shetti et al. | 324/60 |
| 4,878,209 | 10/1989 | Bassett et al. | 368/113 |
| 4,890,270 | 12/1989 | Griffith | 368/113 |
| 5,048,064 | 9/1991 | Rutherford | 377/20 |
| 5,083,299 | 1/1992 | Schwanke et al. | 368/113 |
| 5,181,191 | 1/1993 | Farwell | 368/113 |
| 5,294,559 | 3/1994 | Malhi | 437/40 |
| 5,351,211 | * 9/1994 | Higeta et al. | 365/189.05 |
| 5,581,738 | 12/1996 | Dombrowski | 395/500 |
| 5,606,567 | 2/1997 | Agrawal et al. | 371/22.4 |
| 5,625,288 | 4/1997 | Snyder et al. | 324/158.1 |
| 5,845,233 | 12/1998 | Fishburn | 702/108 |
| 5,923,676 | * 7/1999 | Sunter et al. | 371/22.5 |

OTHER PUBLICATIONS

"The Programmable Logic Data Book", 1998, available from Xilinx, Inc., 2100 Logic Drive, San Jose, California 95124, pp. 4–5 to 4–40.

Application Note from Xilinx, Inc., "Efficient Shift Registers, LFSR Counters, and Long Pseudo–Random Sequence Generators," by Peter Alfke, Jul. 7, 1996.

"Signal Delay in RC Tree Networks," IEEE Transactions on Computer–Aided Design, vol. CAD–2, No. 3, Jul. 1983, pp. 202–211.

* cited by examiner

Primary Examiner—Siegfried H. Grimm
(74) Attorney, Agent, or Firm—Arthur J. Behiel; Edel M. Young

(57) ABSTRACT

A circuit measures a signal propagation delay through a series of memory elements. In one embodiment the memory elements are configured in series so that together they form a delay circuit. In another embodiment the memory elements are configured in a loop to form a ring oscillator. Each memory element propagates a signal to a subsequent memory element so that the time the signal takes to traverse all of the memory elements is proportional to the average delay induced by the individual elements. This proportionality provides an effective means for measuring the delays of those components. Various embodiments of the invention measure the speeds at which memory elements can be preset, cleared, written to, read from, or clock enabled.

22 Claims, 16 Drawing Sheets

CIRCUIT FOR MEASURING SIGNAL DELAYS IN SYNCHRONOUS MEMORY ELEMENTS

CROSS REFERENCE TO RELATED APPLICATIONS

This application is a continuation-in-part of U.S. patent application Ser. No. 09/235,419 filed Jan. 20, 1999, now U.S. Pat. No. 6,075,418, entitled "System With Downstream Set or Clear for Measuring Signal Propagation Delays on Integrated Circuits," by Christopher H. Kingsley, Robert D. Patrie, and Robert W. Wells, filed Nov. 9, 1998 (a completion of provisonal application Ser. No. 60/107,765) which is a continuation-in-part of U.S. patent application Ser. No. 09/115,204, entitled "Built-In Self Test Method For Measuring Clock To Out Delays," by Robert W. Wells, Robert D. Patrie, and Robert O. Conn, filed Jul. 14, 1998, which is a continuation-in-part of U.S. application Ser. No. 08/710,465 filed Sep. 17, 1996, now U.S. Pat. No. 5,790,479 filed Sep. 17, 1996 and issued Aug. 4, 1998. This application is related to:

1) U.S. patent application Ser. No. 09/115,138, now U.S. Pat. No. 6,069,849, entitled "Method and Circuit for Measuring Signal Propagation Delays Using the Duty Cycle of a Ring Oscillator," by Christopher H. Kingsley, Robert W. Wells, Robert D. Patrie, Robert O. Conn, filed Jul. 14, 1998;

2) U.S. patent application Ser. No. 09/114,369, entitled "Method and System for Measuring Signal Propagation Delays Using Ring Oscillators," by Robert D. Patrie, Robert W. Wells, et al., filed Jul. 14, 1998;

3) U.S. patent application Ser. No. 09/244,753, entitled "Built-In AC Self Test Using Pulse Generators," by Gilbert A. Speyer, David L. Ferguson, et al., filed Feb. 5, 1999; and 4) U.S. patent application Ser. No. 09/360,288, entitled "Circuit For Measuring Signal Delays of Asynchronous Register Inputs," by Christopher H. Kingsley, filed herewith.

Each of the foregoing documents is incorporated herein by reference.

FIELD OF THE INVENTION

This invention relates generally to methods and circuit configurations for measuring signal propagation delays, and in particular for measuring signal propagation delays through synchronous memory elements.

BACKGROUND

Integrated circuits (ICs) are the cornerstones of myriad computational systems, such as personal computers and communications networks. Purchasers of such systems have come to expect significant improvements in speed performance over time. The demand for speed encourages system designers to select ICs that boast superior speed performance. This leads IC manufactures to carefully test the speed performance of their designs.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 from input pin 130 to output pin 140. The resulting time period is the timing parameter for test circuit 110, the path of interest. Such parameters are typically published in literature associated with particular ICs and/or used to model the speed performance of circuit designs that employ the path of interest.

Conventional test procedures are problematic for at least two reasons. First, many signal paths within a given IC are not directly accessible via input and output pins, and therefore cannot be measured directly. Second, testers have tolerances that can have a significant impact on some measurements, particularly when the path of interest is short. For example, if a tester accurate to one nanosecond measures a propagation delay of one nanosecond, the actual propagation delay might be any time between zero and two nanoseconds. In such a case the IC manufacturer would have to assume the timing parameter was two nanoseconds, the worst-case scenario. If ICs are not assigned worst-case values, some designs will fail. Thus, IC manufacturers tend to add relatively large margins of error, or "guard bands," to ensure that their circuits will perform as advertised. Unfortunately, this means that those manufacturers will not be able to guarantee their full speed performance, which could cost them customers in an industry where speed performance is paramount.

Programmable logic devices (PLDs) are a well-known type of digital integrated circuit that may be programmed by a user (e.g., a circuit designer) to perform specified logic functions. One type of PLD, the field-programmable gate array (FPGA), typically includes an array of configurable logic blocks (CLBs) that are programmably interconnected to each other and to programmable input/output blocks (IOBs). This collection of configurable logic is configured by loading configuration data into internal configuration memory cells that define how the CLBs, interconnections, and IOBs are configured.

Each programming point, CLB, interconnection line, and IOB introduces some delay into a signal path. The many potential combinations of delay-inducing elements make timing predictions particularly difficult. FPGA designers use "speed files" that include resistance and capacitance values for the various delay-inducing elements and combine them to establish delays for desired signal paths. These delays are then used to predict circuit timing for selected circuit designs implemented as FPGA configurations. FPGA timing parameters are assigned worst-case values to ensure FPGA designs work as indicated.

Manufacturers of ICs, including FPGAs, would like to guarantee the highest speed performance possible without causing ICs to fail to meet the guaranteed timing specifications. More accurate measurements of circuit timing allow IC designers to use smaller guard bands to ensure correct device performance, and therefore to guarantee higher speed performance. There is therefore a need for a more accurate means of characterizing IC speed performance.

SUMMARY

The present invention provides an accurate means of measuring IC speed performance. The inventive circuit is particularly useful for testing programmable logic devices, which can be programmed to include a device for testing a majority of the requisite test circuitry.

In accordance with an embodiment of the invention, a number of synchronous components are configured in a loop to form a free-running ring oscillator. Each synchronous component clocks a subsequent synchronous component in the ring; the subsequent synchronous component responds by clocking the next component in the ring and by clearing the previous component to prepare it for a subsequent clock. The oscillator thus produces an oscillating test signal in which the period includes the clock-to-out delays of the synchronous components as well as the delays of the circuit configuration. This combination provides an effective means for measuring the clock-to-out delays of synchronous components.

Synchronous components can exhibit different propagation delays depending upon whether they are configured to clock in response to rising or falling edges. Some embodiments of the present invention address this problem by separately measuring the clock-to-out delays associated with rising and falling edges. The worst-case delay associated with a given component can then be expressed as the longer of the two. Knowing the precise worst-case delay allows IC designers to minimize the guard band and consequently guarantee higher speed performance.

Clock-to-out delays are not the only propagation delays of interest. Various other type of synchronous and asynchronous signal paths should also be characterized to produce speed files that may be employed to accurately predict IC speed performance. For example, the speeds at which a memory element can be preset, cleared, written to, read from, or clock enabled can also impact speed performance. Other embodiments of the invention are therefore adapted to produce delay data indicative of these additional memory-cell characteristics.

DETAILED DESCRIPTION

Figure 1:
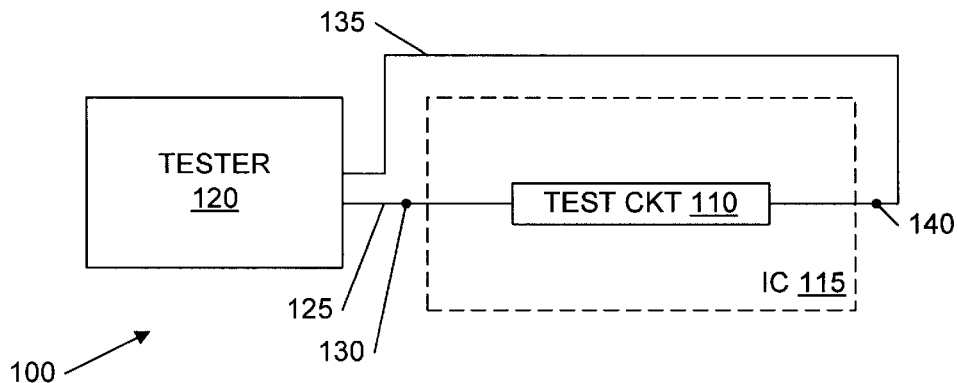
FIG. 1 depicts a conventional test configuration 100 for determining the signal propagation delay of a test circuit 110 in a conventional IC 115.
Figure 2:
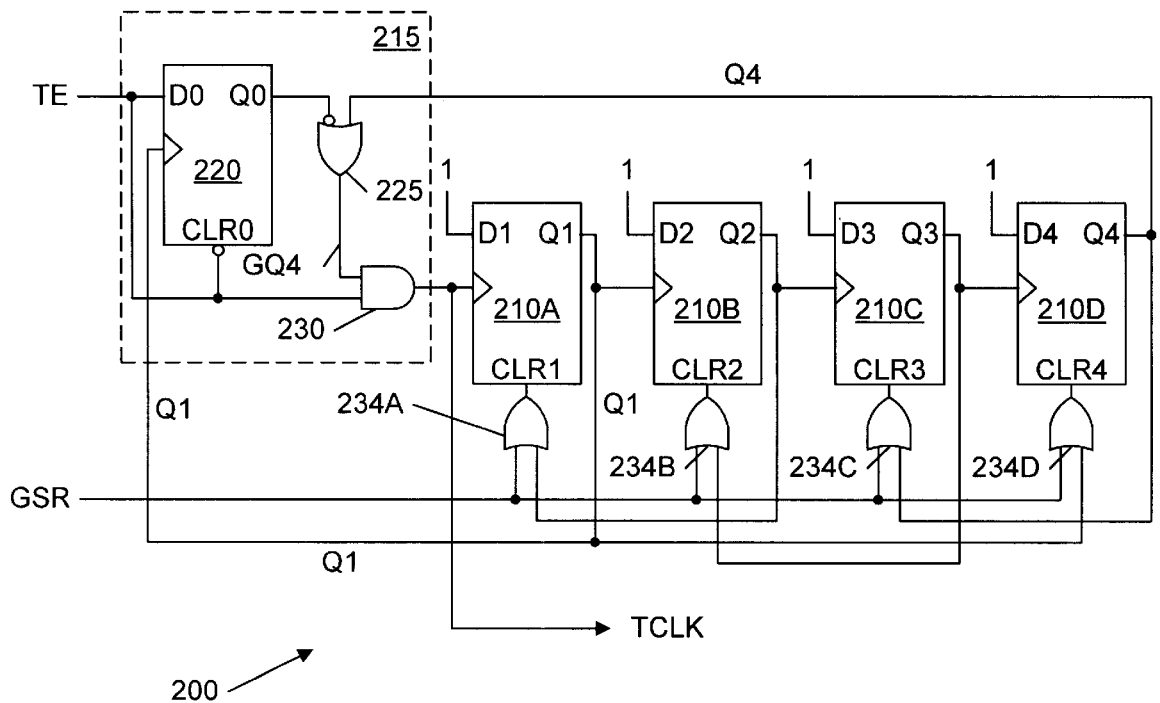
FIG. 2 is a schematic diagram of an oscillator 200 configured to produce a test-clock signal TCLK for which the period $T_{TCLK}$ includes the rising clock-to-out delays of flip-flops 210A–D.

FIG. 2 is a schematic diagram of an oscillator 200. In accordance with the invention, the depicted configuration produces an oscillating test signal having a period including the clock-to-out delays of four synchronous components, flip-flops 210A–210D. Other embodiments include additional signal paths for which the associated signal propagation delays are of interest. Examples of such embodiments are described below in connection with FIGS. 6 and 7.

Oscillator 200 includes an oscillator-enable circuit 215 connected to the clock input of flip-flop 210A via a test-clock line TCLK. Oscillator-enable circuit 215 in turn includes a flip-flop 220, an OR gate 225, and an AND gate 230. As discussed below in connection with FIG. 3, oscillator-enable circuit 215 produces an edge on test-clock line TCLK when a test-enable signal is brought high. Oscillator 200 oscillates in response to the rising edge and continues oscillating until the test-enable signal returns to a logic zero. The duration of the test-enable signal and the number of oscillations that occur while the test-enable signal is asserted are then used to calculate the combined delay through flip-flops 210A–210D.

A test-enable line TE conveys the test-enable signal to a synchronous input terminal D0 of flip-flop 220, an inverting asynchronous input terminal CLR0 of flip-flop 220, and an input terminal of AND gate 230. For purposes of the present disclosure, input terminals are said to be "synchronous" if they effect a change in a memory element only upon receipt of a clock signal, and are said to be "asynchronous" if they change or effect a change in a memory element independent of a clock signal.

A global reset signal GSR connects to the clear inputs CLR1–CLR4 of flip-flops 210A-210D via respective OR gates 234A–24D. An output terminal Q0 of flip-flop 220 connects to an input of OR gate 225. The output terminal of OR gate 225 connects to the remaining input terminal of AND gate 230 via a line GQ4. Oscillator-enable circuit 215 also includes a pair of input lines Q1 and Q4 from respective flip-flops 210A and 210D: line Q1 connects to the clock input of flip-flop 220; line Q4 connects to the second input terminal of OR gate 225.

The synchronous "Q" output terminal of each flip-flop 210A–D connects to:
1) an asynchronous clear terminal of a previous flip-flop via a respective OR gate; and
2) the clock terminal—conventionally designated using a ">" symbol—of a subsequent flip-flop. (Note that line Q4 connects to the clock terminal of 210A via oscillator-enable circuit 215).

For example, output terminal Q3 of flip-flop 210C connects to both the clock terminal of flip-flop 210D and, through OR gate 234B, the asynchronous clear terminal CLR2 of flip-flop 210B. Each rising edge on any given clock terminal thus propagates through to the subsequent flip-flop; the subsequent flip-flop then clears the preceding flip-flop to prepare the preceding flip-flop for the next rising edge. Each subsequent flip-flop thus acts as a delay element between the output terminal and the clear terminal of the previous flip-flop. Output Q4 from flip-flop 210D is connected, through circuit 215, to the clock input terminal of flip-flop 210A so that flip-flops 210A–D form a ring oscillator.

Figure 3:
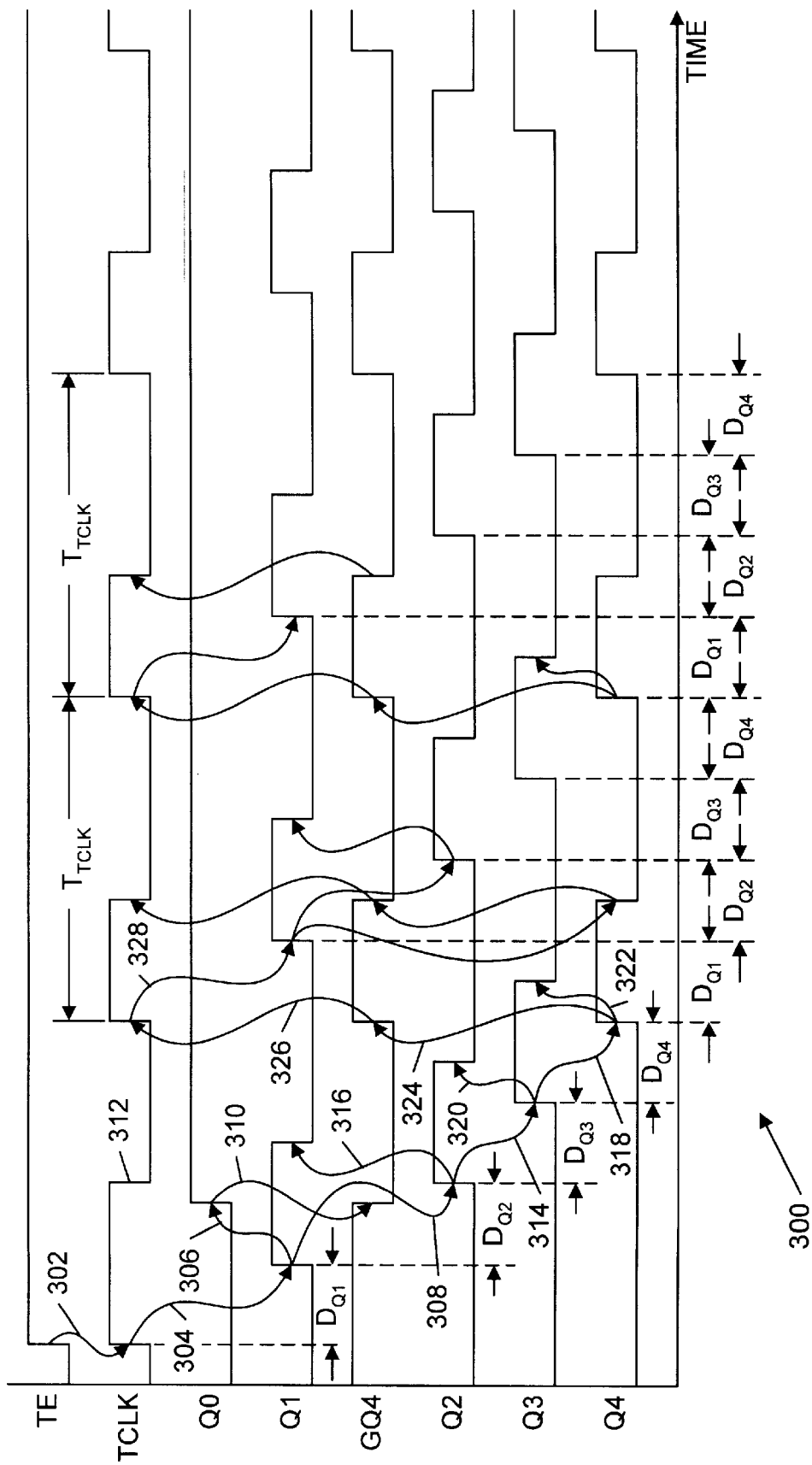
FIG. 3 is a waveform diagram depicting the operation of oscillator 200 of FIG. 2.

FIG. 3 is a waveform diagram depicting the operation of oscillator 200 of FIG. 2. Each waveform in FIG. 3 is labeled using the corresponding node designation depicted in FIG. 2. Lines terminating with differently named input and output nodes are named for output nodes. For example, the line connecting output terminal Q2 of flip-flop 210B to the clock terminal of flip-flop 210C and the clear terminal of flip-flop 210A is labeled "Q2." The node designations are hereafter used to alternatively refer to circuit nodes or their corresponding signals. In each instance, the interpretation of the node designations as either signals or physical elements will be clear from the context.

Though not depicted in FIG. 3, the signal on global reset line GSR is asserted (i.e., is raised to a logic one) prior to each test cycle to prepare oscillator 200 for test. Asserting signal GSR clears each of flip-flops 210A–210D. Thus, the respective "Q" outputs of flip-flops 210A–D are at logic zero. Also prior to each test cycle, test-enable line TE is deasserted (i.e., at logic zero). The low logic level on the clear input of flip-flop 220 resets flip-flop 220. OR gate 225, having a logic zero on its inverting input from output Q0, outputs a logic one on line GQ4. The signal GSR must be de-asserted sufficiently in advance of a test cycle to ensure that the clear input to flip-flops 210A–D have returned to a logic zero. In one embodiment, input terminal D0 is tied high (i.e., to a logic one) instead of connected to test-enable line TE.

Referring now to FIG. 3, a test cycle begins when test-enable line TE is asserted (brought to a logic one). Because line GQ4 is also a logic one, AND gate 230 passes the rising edge from test-enable signal TE to test-clock terminal TCLK (arrow 302), and consequently to the clock terminal of flip-flop 210A. The rising edge on the clock terminal of flip-flip 210A clocks flip-flop 210A so that the logic one on input terminal D1 transfers to output terminal Q1 after the clock-to-out delay $D_{Q1}$ associated with flip-flop 210A (arrow 304).

The rising edge of signal Q1 does three things. First, the rising edge of signal Q1 clocks flip-flop 210B so that the logic one on input D2 transfers to output terminal Q2 after the clock-to-out delay $D_{Q2}$ associated with flip-flop 210B (arrow 308). Second, the rising edge of signal Q1 clears flip-flop 210D. Clearing flip-flop 210D has no impact in the first instance of a rising edge on terminal Q1. However, as described below, each subsequent rising edge on test-clock line TCLK occurs when output Q4 of flip-flop 210D goes high; thus flip-flop 210D must be reset (cleared) to prepare TCLK for subsequent rising edges. Third, the rising edge on line Q1 clocks flip-flop 220, causing a rising edge on output line Q0 (arrow 306). Line Q0 then remains at logic one for the duration of the test period, or as long as test-enable signal TE is asserted.

The rising edge on line Q0 produces a falling edge on line GQ4 (arrow 310), which in turn produces a falling edge 312 on line TCLK. Flip-flop 210A, a positive-edge-triggered flip-flop, is unaffected by falling edge 312. Falling edge 312 is important, however, because it prepares flip-flop 210A to respond to a subsequent rising clock edge.

The rising edge of signal Q2 clocks flip-flop 210C so that the logic one on input D3 transfers to output Q3 after the clock-to-out delay $D_{Q3}$ associated with flip-flop 210C (arrow 314). The rising edge of signal Q2 also clears flip-flop 210A, returning output terminal Q1 to a logic zero (arrow 316). The resulting rising edge of signal Q3 then clocks flip-flop 210D so that the logic one on input D4 transfers to output Q4 after the clock-to-out delay $D_{Q4}$ associated with flip-flop 210D (arrow 318). The rising edge of signal Q3 also clears flip-flop 210B (arrow 320). Finally, the rising edge on line Q4 clears flip-flop 210C (arrow 322) and propagates through OR gate 225 and AND gate 230 to clock flip-flop 210A once again (arrows 324 and 326). Oscillator 200 then continues to cycle a pulse through flip-flops 210A–D until test-enable line TE returns to a logic zero, causing AND gate 230 to block the feedback from flip-flop 210D from clocking flip-flop 210A.

Cycling a pulse through flip-flops 210A–210D produces an oscillating test signal on test-clock terminal TCLK. The period $T_{TCLK}$ of the test signal includes the sum of clock-to-out delays $D_{Q1}$, $D_{Q2}$, $D_{Q3}$, and $D_{Q4}$.

Figure 4:
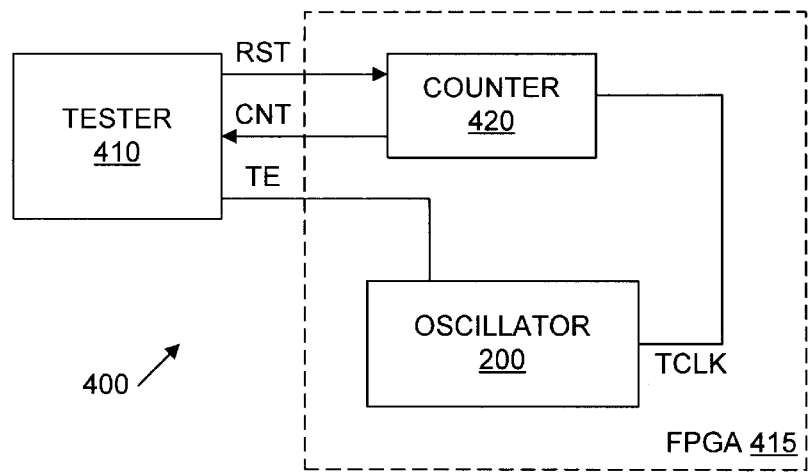
FIG. 4 is a schematic diagram of a system 400 for measuring test-clock period $T_{TCLK}$ of oscillator 200 of FIG. 2.

FIG. 4 is a schematic diagram of a system 400 for measuring test-clock period $T_{TCLK}$ of oscillator 200 of FIG. 2. System 400 includes a conventional tester 410 connected to an FPGA 415. In accordance with the invention, FPGA 415 is configured to include a counter 420 and oscillator 200. System 400 may also be used with other types of oscillators, such as those described below in connection with FIGS. 5 and 6.

Test-clock line TCLK connects to counter 420. Counter 420 is a conventional binary counter adapted to count the number of rising edges on line TCLK. Counter 420 connects to tester 410 via a test-count line (or lines) CNT and a reset line RST. Reset line RST allows tester 410 to reset counter 420 to zero.

Tester 410 defines a test period by asserting test-enable signal TE. Oscillator 200 outputs an oscillating test-clock signal TCLK for as long as test-enable signal TE is asserted, and counter 420 increments for each rising edge of the test-clock signal TCLK. Thus, after test-enable line TE is asserted for the test period, counter 420 will contain the number of oscillations (plus or minus one at startup and shutdown) that oscillator 200 generated over the test period. This number is fed to tester 410 on line CNT. Calculating the period $T_{TCLK}$ of oscillator 200 is then a simple matter of dividing the test period by the number of counts stored in counter 420. For example, if test-enable line TE was held high for one second to achieve a count of 1,000, then the oscillation period $T_{TCLK}$ of oscillator 237 is one second divided by 1,000, or 1 millisecond. The error in the measurement depends on the value counted. Since the count can be off by one, the actual period in the foregoing case might be 0.999 milliseconds to 1.001 milliseconds, for example.

System 400 provides a very accurate measure of the delay through oscillator 200 by counting over many cycles. Moreover, the method is relatively inexpensive to implement using FPGAs because FPGAs can be configured to simultaneously include many test circuits and the test circuitry (e.g., counter 420) required to test them.

In practice, synchronous components can exhibit different propagation delays depending upon whether they are configured to respond to rising clock edges or falling clock edges. There is therefore a need for a way to determine the clock-to-out delays for synchronous components adapted to respond to falling clock edges.

Figure 5:
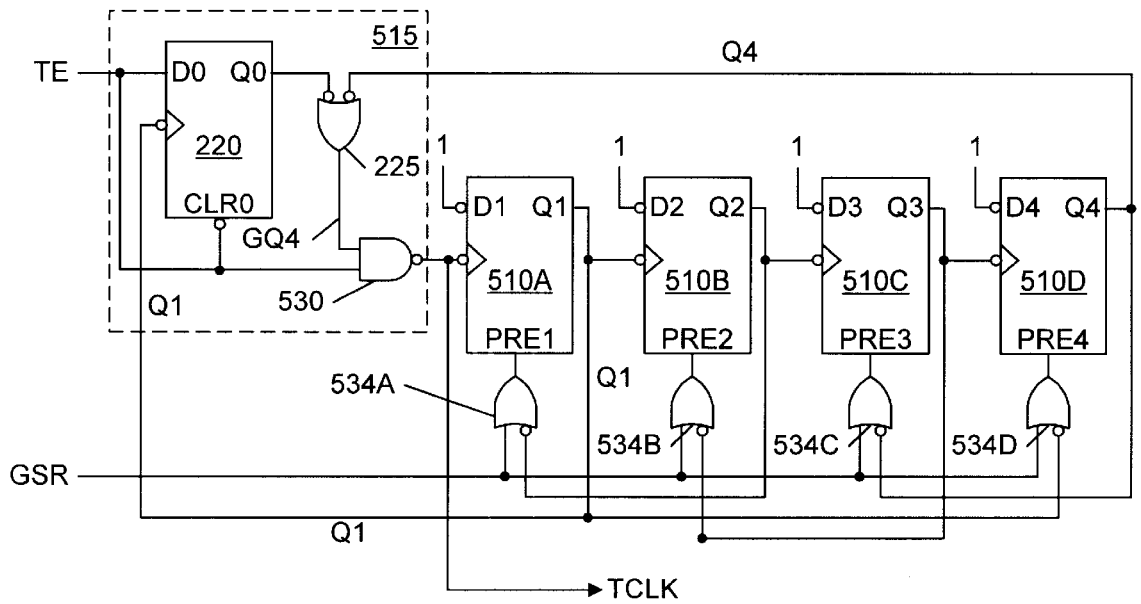
FIG. 5 is a schematic diagram of an oscillator 500 configured to produce a test-clock signal TCLK for which the period $T_{TCLK}$ includes the falling clock-to-out delays of flip-flops 510A–D.

FIG. 5 is a schematic diagram of an oscillator 500 configured to produce a test-clock signal TCLK for which the period $T_{TCLK}$ includes the clock-to-out delays of flip-flops 510A–510D. Flip-flops 510A–510D are falling-edge triggered, as indicated by the "bubbles" on their respective clock terminals. The operation of oscillator 500 is similar to that of oscillator 200 of FIG. 2, except that the test-clock period $T_{TCLK}$ of oscillator 500 includes the delays associated with falling edges propagating through flip-flops 510A–510D, whereas the test-clock period $T_{TCLK}$ of oscillator 200 includes the delays associated with rising edges propagating through flip-flops 210A–210D.

Flip-flops 510A–510D are similar to flip-flops 210A–210D. However, the respective "D" inputs are connected to logic zero, the clock terminals are negative-edge triggered, and instead of having feedback connections to clear inputs as in flip-flops 210A–210D, each of flip-flops 510A–510D has a feedback line connected through inverting inputs of one of OR gates 534A–534D to a respective preset terminal (e.g., output terminal Q2 of flip-flop 510B connects through OR gate 534A to preset terminal PRE1 of flip-flop 510A). Oscillator 500 also includes an oscillator-enable circuit 515 that is similar to oscillator-enable circuit 215, but differs in that the polarities of the clock input terminal of flip-flop 220 and the Q4 input terminal of OR gate 225 are reversed, and AND gate 230 is replaced by a NAND gate 530. Due to the similarities of oscillators 200 and 500, a detailed description of the operation of oscillator 500 is omitted for brevity.

Oscillator 200 of FIG. 2 and oscillator 500 of FIG. 5 can be used to determine, separately, the delays associated with falling and rising edges propagating through flip-flops of the type used to implement flip-flops 210A–D and 510A–D. The worst-case delay for such flip-flops can then be expressed as the longer of the two. Knowing the precise worst-case delay allows IC designers to minimize the guard band and consequently guarantee higher speed performance. In addition, knowing which type of signal transition propagates more slowly allows IC designers to optimize signal paths more efficiently by focusing on those components responsible for the slower performance.

Clock-to-out delays are not the only propagation delay of interest. Various types of asynchronous signal paths are also characterized to produce speed files that may be employed to accurately predict IC speed performance. Some embodiments of the invention are therefore adapted to measure the delays associated with asynchronous test circuits.

Figure 6:
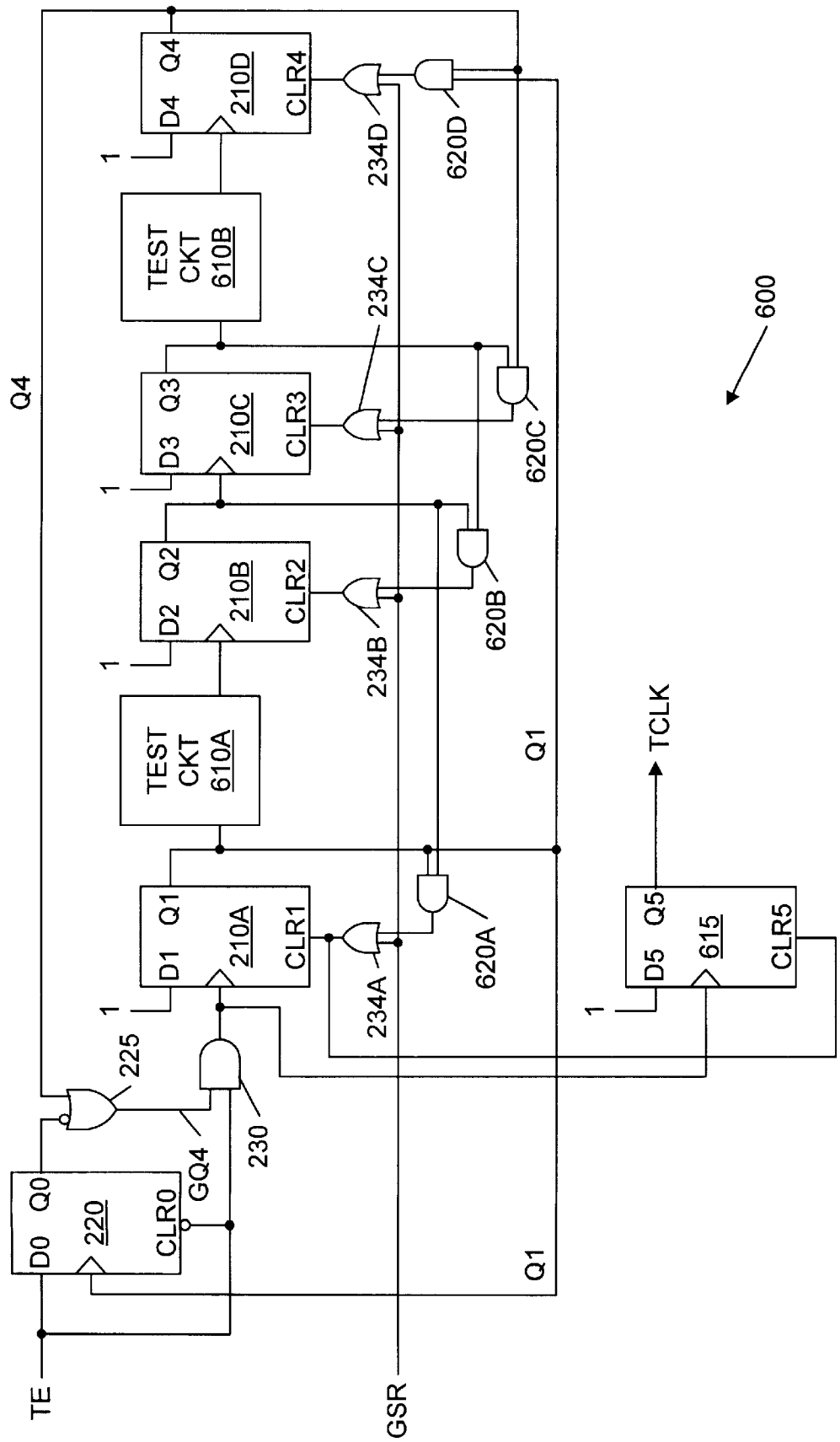
FIG. 6 is a schematic diagram of an oscillator 600 configured to produce a test-clock signal TCLK for which the period $T_{TCLK}$ includes the combined delays of flip-flops 210A–D and test circuits 610A and 610B.

FIG. 6 is a schematic diagram of an oscillator 600 configured, in accordance with the invention, to include a pair of similar asynchronous test circuits 610A and 610B. Test circuits 610A and 610B might be any signal paths for which the associated signal propagation delays are of interest. In one embodiment, for example, test circuits 610A and 610B are signal paths on an FPGA.

Oscillator 600 is similar to oscillator 200, like-numbered elements being the same. Oscillator 600 additionally includes a flip-flop 615 and four AND gates 620A–D. Flip-flop 615, identical to flip-flop 210A, minimizes the loading effect of test-clock line TCLK so that the clock-to-out timing of flip-flops 210A–D is accurately represented by the oscillation period of oscillator 600. In an alternate embodiment, flip-flop 615 is configured as a toggle flip-flop, which changes state each clock period to produce a 50% duty cycle on test-clock terminal TCLK. Placing a buffer between the output of AND gate 230 and test-clock terminal TCLK also reduces loading on AND gate 230.

As with oscillator 200, the test-clock period $T_{TCLK}$ of test-clock signal TCLK includes the rising-edge delay through flip-flops 210A–210D. However, the addition of test circuits 610A and 610B increases the signal propagation delay through flip-flops 210A–D so that the total test-clock period $T_{TCLK}$ increases by an amount equal to the combined rising-edge delay $D_R$ of test circuits 610A and 610B.

If a rising edge propagates too quickly through flip-flops 210A–210D, it is possible that the rising edge can arrive to clock one of flip-flops 210A–210D while the clear signal on its clear terminal is still asserted. Such a case could stop oscillator 600 from oscillating. AND gates 620A–620D reduce the likelihood of such a stoppage by reducing the pulse width of the clear signal. Without AND gate 620C, for example, the clear signal CLR3 rises and falls with signal Q4. With AND gate 620C, the clear signal CLR3 still rises with signal Q4, but falls with signal Q3.

Test circuits 610A and 610B might be a pair of identical signal paths or a bisected signal path. Providing a pair of test circuits in the depicted configuration produces a more balanced test-clock waveform, helping to ensure that one edge of test-clock signal TCLK does not overtake another on the way to the counter (e.g., counter 420 of FIG. 4).

Figure 7:
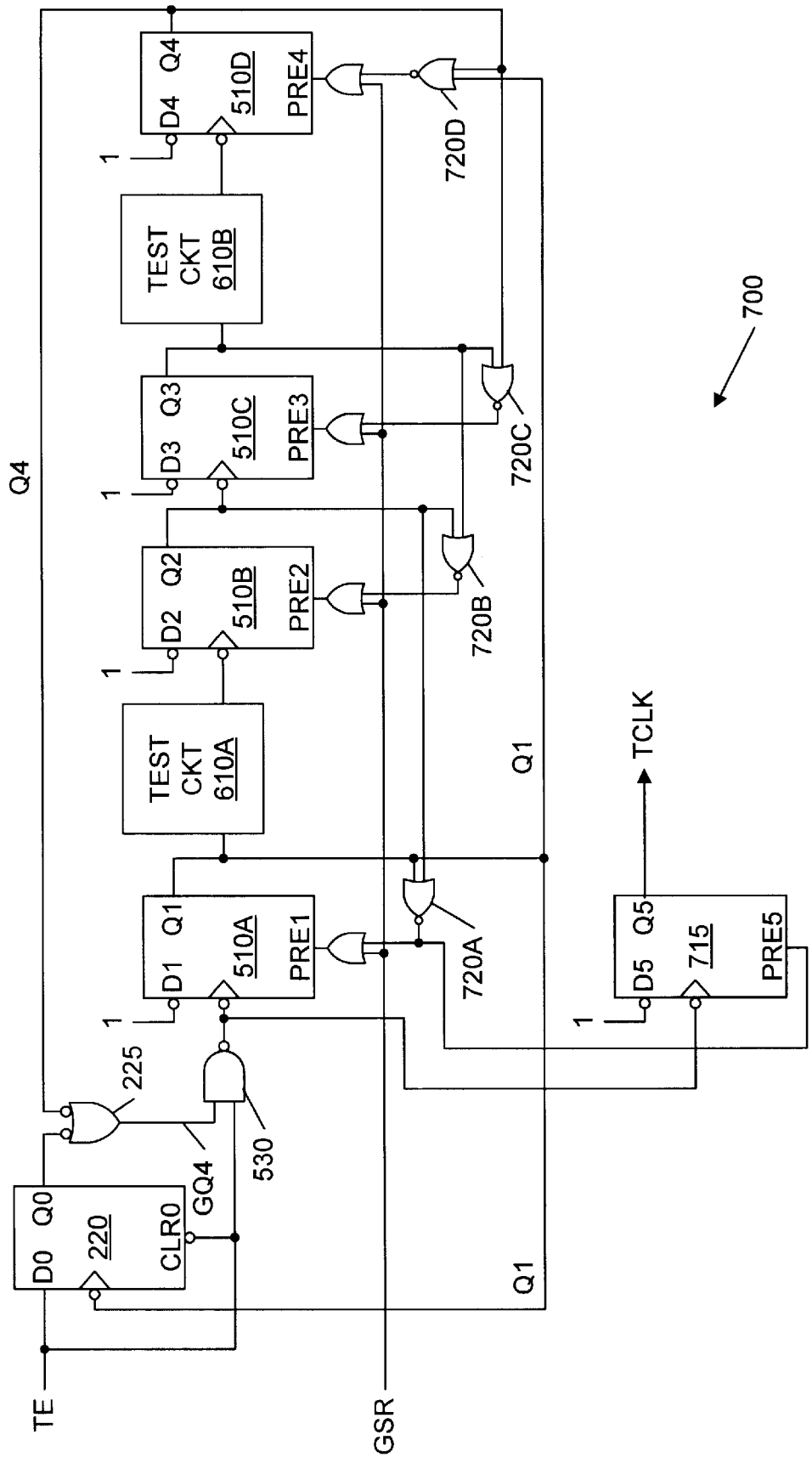
FIG. 7 is a schematic diagram of an oscillator 700 configured to produce a test-clock signal TCLK for which the period $T_{TCLK}$ includes the combined delays of flip-flops 510A–D and test circuits 610A and 610B.

FIG. 7 is a schematic diagram of an oscillator 700 similar to oscillator 500 of FIG. 5, like-numbered elements being the same. Oscillator 700 also includes the same test circuits 610A and 610B depicted in FIG. 6. Oscillator 700 is configured so that test-clock period $T_{TCLK}$ includes the falling-edge delay $D_F$ through flip-flops 210A–D and test circuits 610A and 610B. The differences between oscillator 700 and oscillator 600 are similar to the differences between oscillator 400 and oscillator 200. A complete description of the operation of oscillator 700 is therefore omitted for brevity.

Figure 8A:
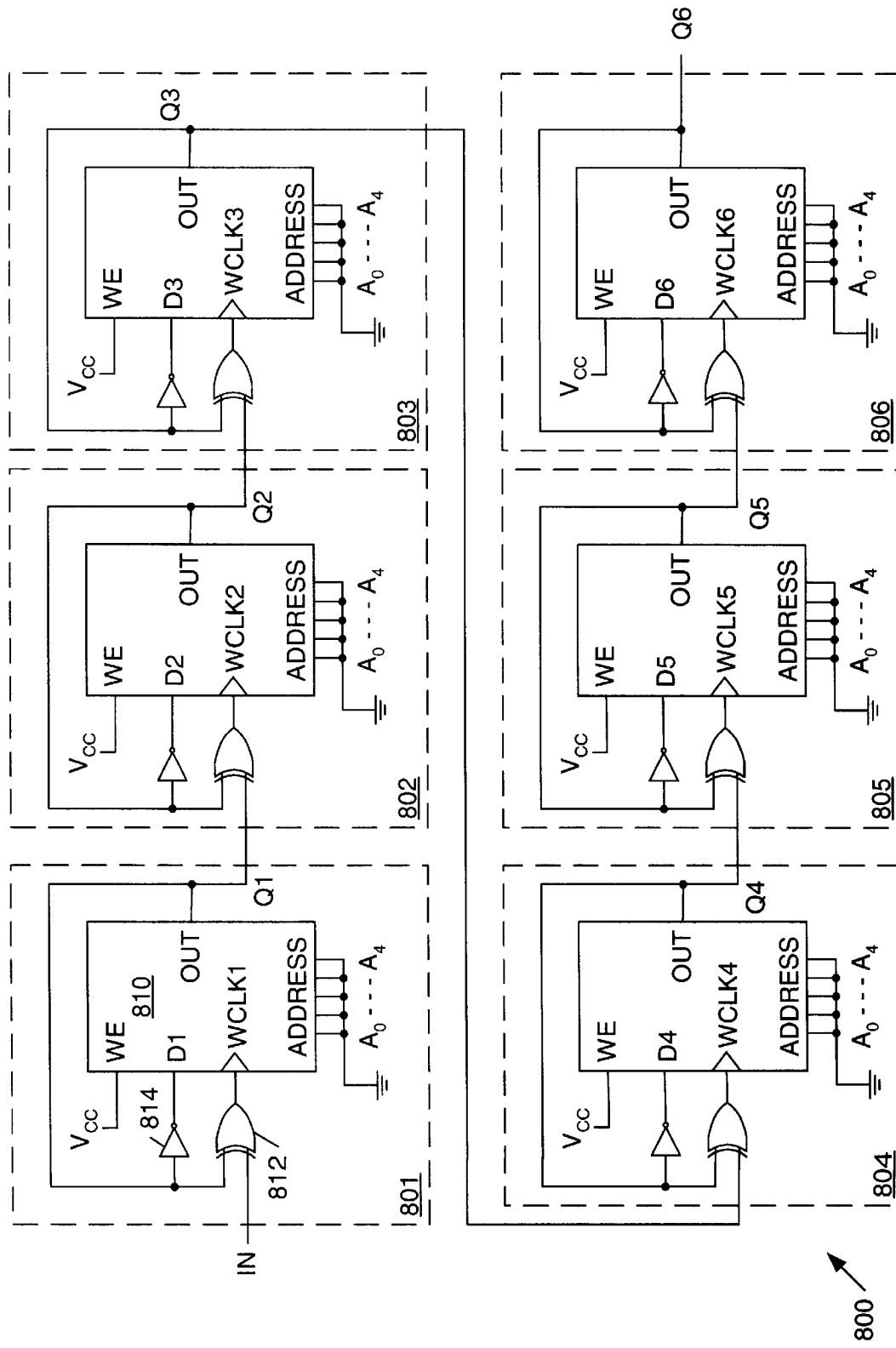
FIG. 8A depicts a delay circuit 800 that can be used in accordance with the invention to measure write delays associated with random-access memory (RAM) elements.

FIG. 8A depicts a delay circuit 800 that can be used in accordance with the invention to measure write delays associated with random-access memory (RAM) elements. Delay circuit 800 includes six similar RAM elements 801 through 806 connected in series; other embodiments include more or fewer RAM elements. RAM elements 801 through 806 are identically configured, like-named elements being the same. RAM elements 801–806 are configured so that a rising edge on an input terminal IN produces a rising or falling edge on an output terminal Q6 after a delay period determined, in part, by the clock-to-out delays of RAM elements 801–806. The following description is limited to RAM element 801 for simplicity.

RAM element 801 includes a RAM cell 810, an XOR gate 812, and an inverter 814. RAM cell 810 conventionally includes a write-enable terminal WE, a synchronous input terminal D1, a write-clock terminal WCLK1, an output terminal OUT, and address terminals A0–A4. Other embodiments can use RAM cells of different sizes. As is conventional, RAM cell 810 stores the value presented on input D at the storage location indicated by the logic levels on address terminals A0–A4 upon receipt of a positive clock edge on clock terminal WCLK1. Also conventional, this functionality can be disabled by presenting a logic zero on write-enable terminal WE.

Figure 8B:
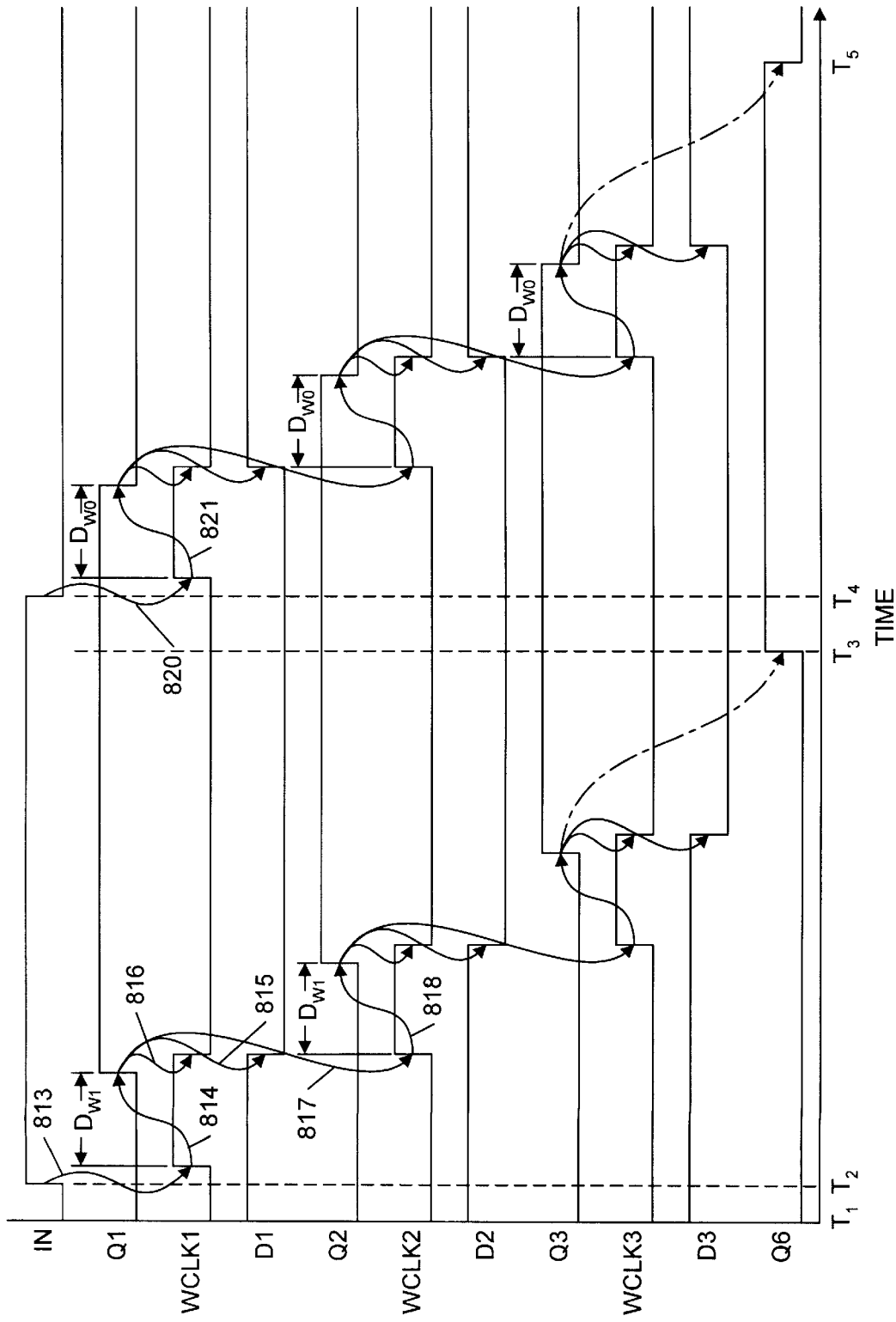
FIG. 8B is a waveform diagram depicting the operation of delay circuit 800 of FIG. 8A.

FIG. 8B is a waveform diagram depicting the operation of delay circuit 800 of FIG. 8A. To begin with, logic zeros are written into each RAM element 801–806 at the selected address, address 0000 in the depicted example. The outputs Q1–Q6 of respective RAM elements 801–806 are therefore logic zeros at time T1.

A rising edge is applied to input terminal IN at time T2. XOR gate 812 passes on this edge to the clock terminal of RAM cell 810 (arrow 813). The rising edge on the clock terminal causes RAM cell 810 to write the logic one on data terminal D1 and provide this logic level on output Q1 (arrow 814). The time required to write the logic one is the write delay $D_{W1}$ (for "delay write 1") of RAM cell 810.

The transition of output Q1 to a logic one accomplishes three results. First, the transition inverts the logic level on data terminal D1 to a logic zero (arrow 815), preparing RAM cell 810 to write a logic zero on a subsequent clock edge. Second, the transition on output terminal Q1 causes XOR gate 812 to provide a logic zero on clock terminal WCLK1 (arrow 816), preparing RAM cell 810 to receive a subsequent rising edge. Finally, the transition on terminal Q1 to a logic one provides a rising edge to RAM element 802. RAM element 802 responds to the rising edge in the same manner that RAM element 801 responded to the rising edge on input terminal IN. That is, RAM element 802 responds to the rising edge on output terminal Q1 by producing a rising edge on output terminal Q2 after a write delay $D_{W1}$ associated with writing a logic one to the RAM cell in RAM element 802 (arrows 817 and 818). The rising edge originally applied to input terminal IN similarly propagates through each downstream RAM element 803–806 until RAM element 806 outputs a logic one on output terminal Q6 (time T3).

The total delay from the rising edge on input terminal IN (time T2) to the rising edge on output terminal Q6 (time T3) is determined, in part, by the cumulative write delays associated with writing logic ones into each RAM cell. The total delay therefore provides information useful in determining the average write delay when writing logic ones into a RAM cell.

Write delays can differ depending upon whether the written data is a logic one or a logic zero. Delay circuit 800 is configured to model both types of write operations. Referring again to FIG. 8B, each RAM cell 810 outputs a logic one after a rising edge propagates through delay circuit 800. This state is depicted just after time T3. Then, at time T4, a negative edge is provided to input terminal IN. Because output terminal Q1 is at logic one, so too is one input terminal of XOR gate 812. The falling edge on input terminal IN is therefore inverted, providing a rising edge on clock terminal WCLK1 (arrow 820). The rising clock edge causes RAM cell 810 to write the data on data terminal D1, now a logic zero, into address location 00000 and provide that data on output terminal Q1 (arrow 821). The time required to write the logic zero is the write delay $D_{W0}$ (for "delay write 0") associated with writing a logic zero into RAM cell 810. The falling edge similarly propagates through the remaining RAM elements 802 to 806 until output terminal Q6 falls at time T5. The total delay from the falling edge on input terminal IN to the falling edge on output terminal Q6 is determined, in part, by the write delays associated with writing logic zeros into each RAM cell. The total delay therefore provides information useful in determining the average write delay when writing logic zeros into a RAM cell.

Figure 9A:
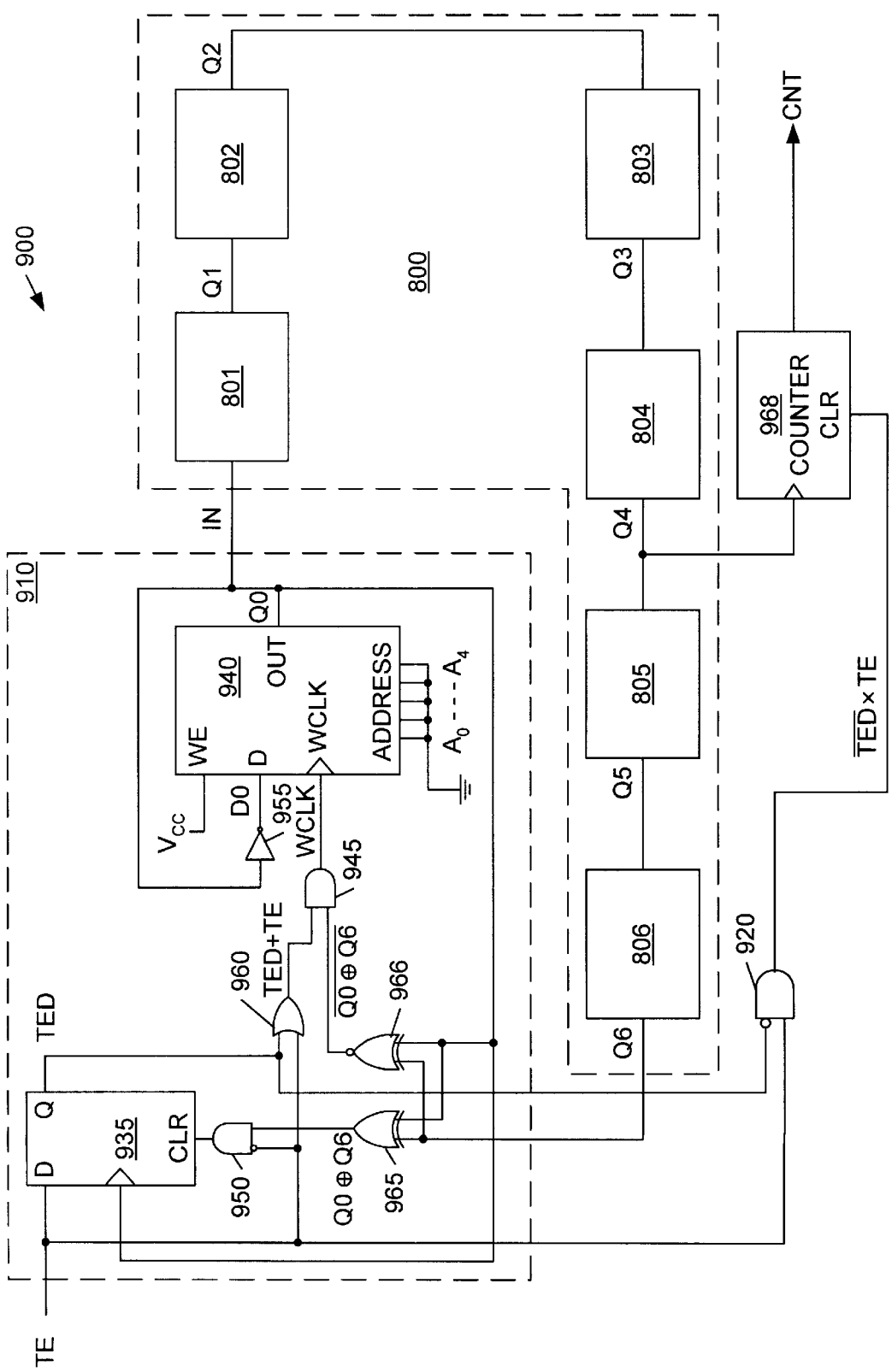
FIG. 9A is an embodiment of the invention in which delay circuit 800 is incorporated into an oscillator 900.

As discussed above in connection with FIGS. 2–4, incorporating a delay circuit into an oscillator is an excellent way to determine the delay of the delay circuit. FIG. 9A is an embodiment of the invention in which delay circuit 800 is incorporated into an oscillator 900.

Oscillator 900 includes an oscillator-enable circuit 910 connected between input terminal IN and output terminal Q6 of delay circuit 800 of FIG. 8A. Oscillator-enable circuit 910 includes a D flip-flop 935, a RAM cell 940, AND gates 945 and 950, an inverter 955, an OR gate 960, an XOR gate 965, and an XNOR gate 966. Oscillator-enable circuit 910 initiates and maintains alternating rising and falling edges through delay circuit 800. The frequency of the resulting oscillations may then be used to gather information about the clock-to-out delays of RAM cells like RAM cell 810. A counter 968, connected in this embodiment to the output Q4 of RAM element 804, clears when test-enable signal TE is asserted and then counts the number of logic transitions that occur over the duration of test-enable signal TE. The resulting count and the duration of the asserted test-enable signal TE can then be used to determine the period of oscillator 900.

Figure 9B:
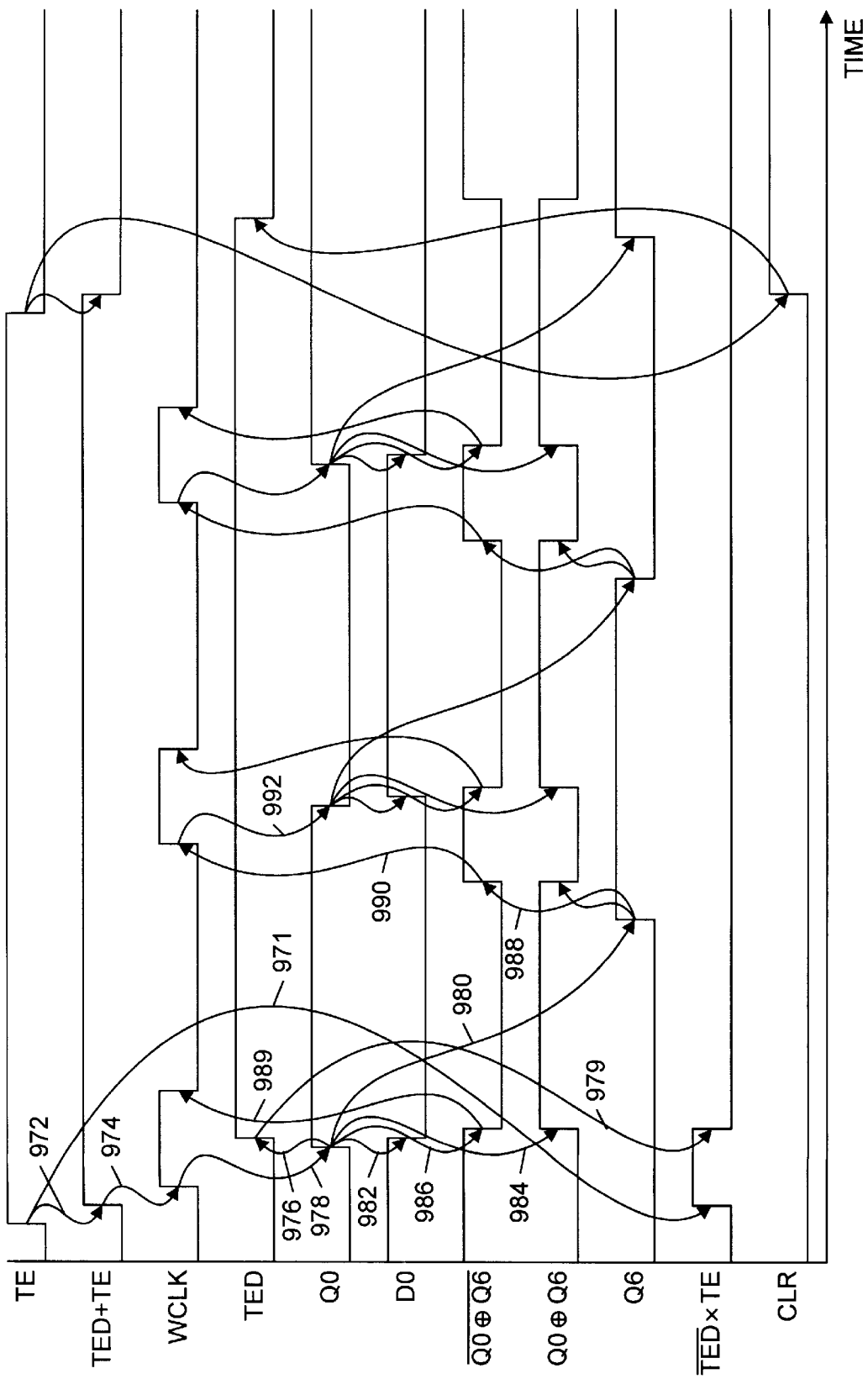
FIG. 9B is a waveform diagram depicting the operation of oscillator 900 of FIG. 9A.

FIG. 9B is a waveform diagram depicting the operation of oscillator 900 of FIG. 9A. A test-enable signal TE determines the duration of oscillation. When test-enable signal TE is brought high, the output of AND gate 920 also goes high, clearing counter 968. At the same time, the rising edge of test-enable signal TE propagates through OR gate 960 and AND gate 945 to clock RAM cell 940 (arrows 972 and 974). The resulting rising edge on write clock line WCLK clocks RAM cell 940, causing output terminal Q0 to rise (arrow 978). The rising edge on output terminal Q0 then clocks flip-flop 935, causing the signal TED to rise (arrow 976), which in turn causes the output of AND gate 920 to return to a logic zero (arrow 979), allowing counter 968 to increment with each rising edge on output terminal Q4. The rising edge on output terminal Q0 then propagates through delay circuit 800 as described above in connection with FIGS. 8A and 8B (arrow 980).

In addition to propagating through delay circuit 800, the rising edge on terminal Q0 causes the signal on terminal D0 to fall (arrow 982), preparing RAM cell 940 to write a logic zero on a subsequent cycle. The rising edge also inverts the outputs of each of XOR gate 965 and XNOR gate 966 (arrows 984 and 986). The resulting high logic level from XOR gate 965 enables AND gate 950 to clear flip-flop 935 in the event that test-enable signal TE returns to a logic zero, signaling the end of a test period; the resulting low logic level from XNOR gate 966 causes the write-clock line WCLK to return to a logic zero (arrow 989).

Returning write-clock terminal WCLK to a low level prepares RAM cell 940 to clock on a subsequent rising clock edge. This subsequent edge occurs when the signal propagating through delay circuit 800 reaches output terminal Q6. The rising logic level on output terminal Q6 causes the output of XNOR gate 966 to return to a logic one (arrow 988), and this rising edge in turn propagates through AND gate 945 and clocks RAM cell 940 once again (arrow 990). This time, however, data input terminal D0 writes a logic zero into RAM cell 940 (arrow 992).

In the example, all address terminals A0–A4 are tied to ground (i.e., logic zero) so the logic zero from input terminal D0 is written into address 0000. Other embodiments use different addresses, or even sequence through different addresses as oscillator 900 oscillates. For example, the address might increment by one for each period of oscillator 900. In other embodiments, random addresses might be selected.

The logic zero on output terminal Q0 propagates through delay circuit 800 in the manner described above in connection with FIGS. 8A and 8B. Oscillator-enable circuit 910 once again clocks RAM cell 940 after the falling edge propagates through delay circuit 800. In this way, oscillator 900 oscillates at a frequency that is determined, in part, by the average delays for writing both ones and zeros into RAM elements 801–806, and consequently on the write-to-out delays of the RAM cells therein.

Returning test-enable signal TE to a logic zero stops oscillator 900, at which point counter 968 contains a count equal to the number of oscillations that occurred while test-enable signals TE and TED were asserted. The period of oscillator 900 is then calculated by dividing the count into the duration of the test-enable signal.

Figure 10A:
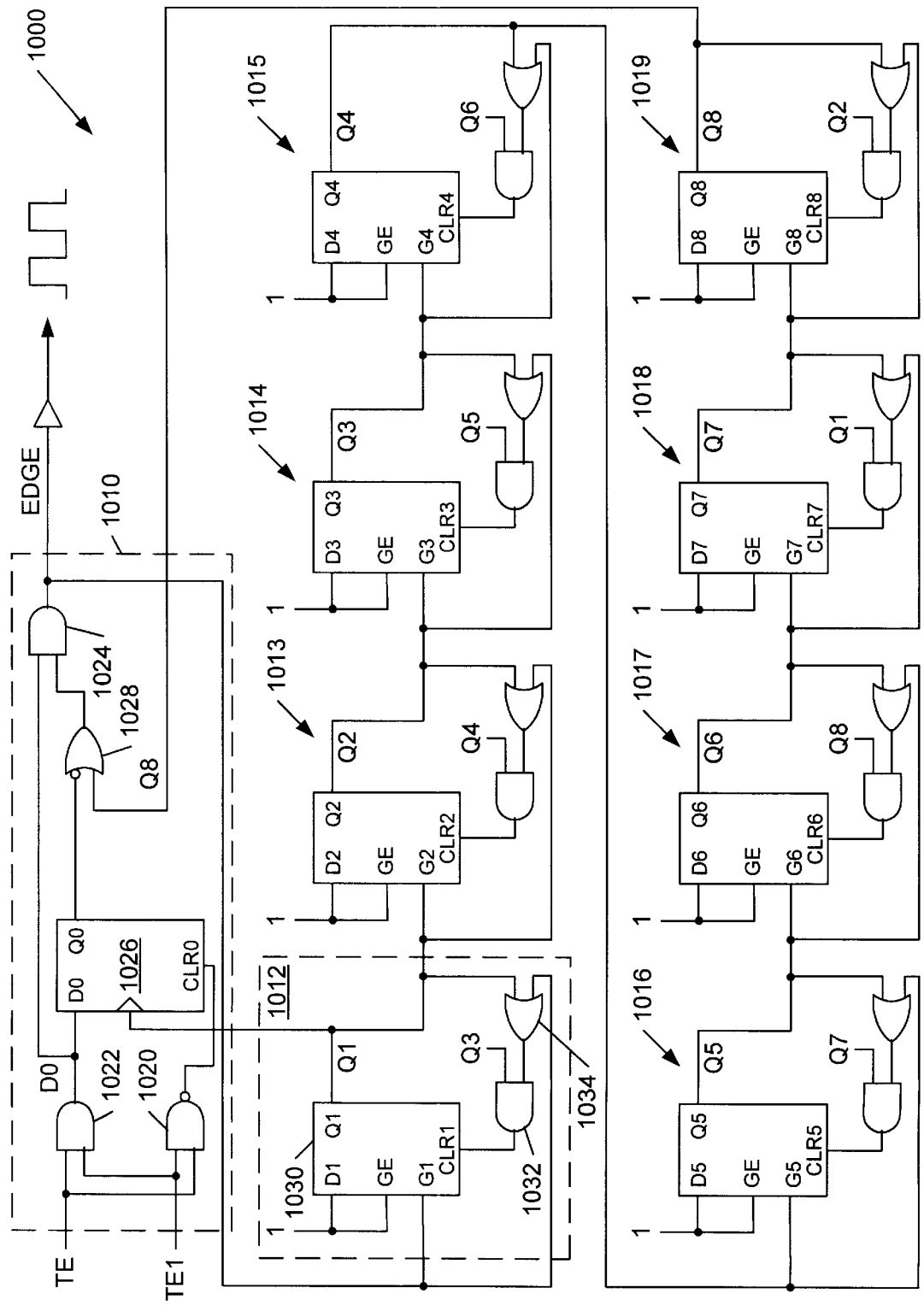
FIG. 10A depicts an oscillator 1000 that can be used in accordance with the invention to measure the delay between a clock terminal G and output terminal Q of D registers configured as latches.

FIG. 10A depicts an oscillator 1000 that can be used in accordance with the invention to measure the delay between a clock terminal G and output terminal Q of D-type latches. Hereafter, this delay is referred to as the "clock-to-Q delay." (Labeling the clock terminal "G" is conventional when referring to a latch.)

Oscillator 1000 includes an oscillator-enable circuit 1010 and eight identical latch stages 1012–1019. Oscillator-enable circuit 1010 includes a NAND gate 1020, a pair of AND gates 1022 and 1024, a D flip-flop 1026, and an OR gate 1028. Latch stage 1012 includes a level-triggered D latch 1030, an AND gate 1032, and an OR gate 1034.

Oscillator-enable circuit 1010 produces a rising edge in response to a pair of test-enable signals TE and TE1. The edge then traverses latch stages 1012–1019. Once through the last latch stage 1019, the edge is fed back, through oscillator-enable circuit 1010, to the first stage 1012. Latch stages 1012–1019 therefore form a ring oscillator. As shown below, the period of the oscillator depends upon the clock-to-Q delay of each latch stage 1012–1019, and can therefore be used to measure the timing behavior of those elements.

Figure 10B:
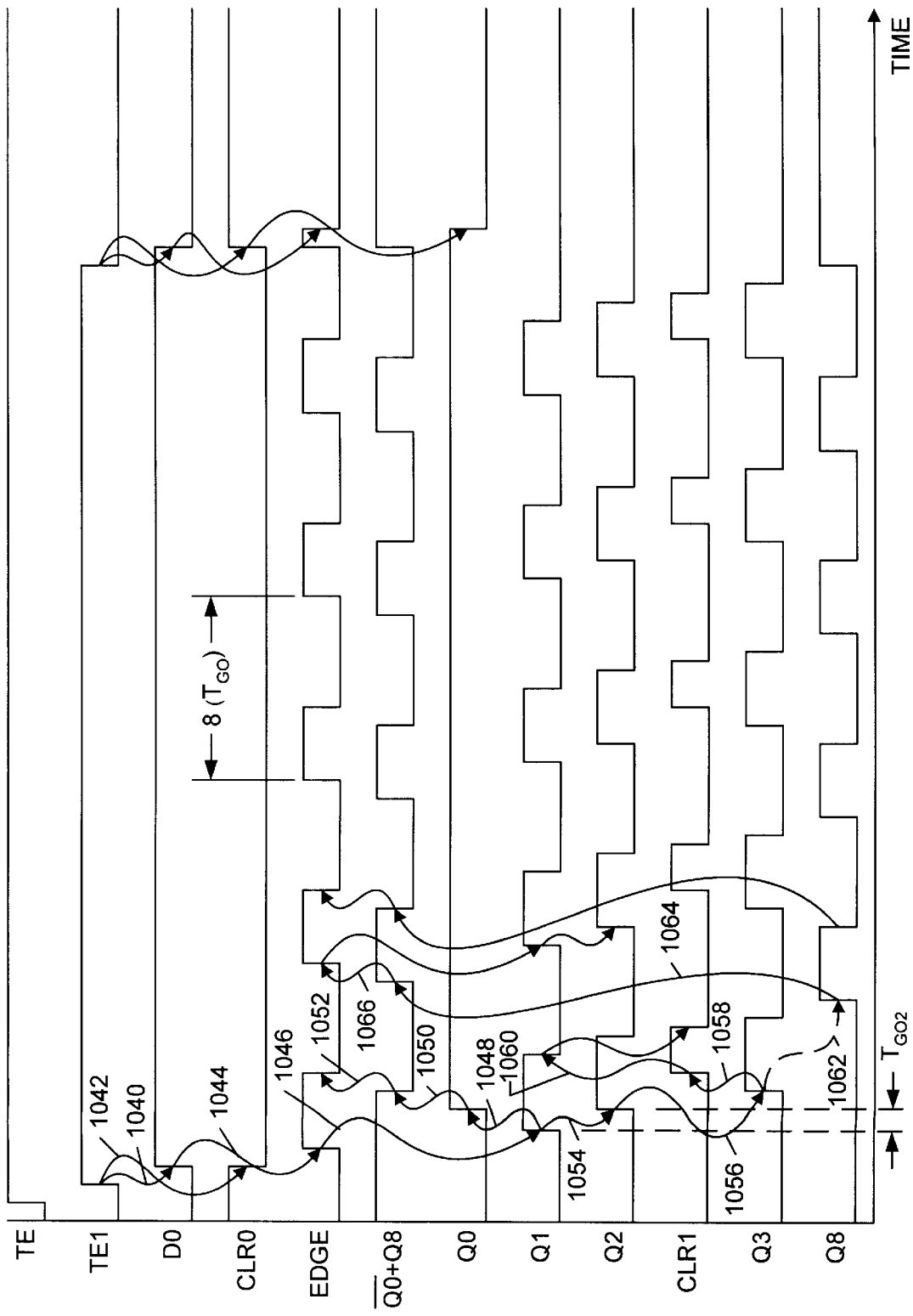
FIG. 10B is a waveform diagram depicting the operation of oscillator 1000 of FIG. 10A.

FIG. 10B is a waveform diagram depicting the operation of oscillator 1000 of FIG. 10A. Oscillator 1000 has two test-enable lines. The first, TE, is a global test-enable line; the second, TE1, is a local test-enable line for oscillator 1000. This configuration can be used, for example, when a number of oscillators are instantiated on different areas of an FPGA and a test engineer wants to test them independently. Both test enable lines TE and TE1 are brought high to initiate oscillation.

Raising both test-enable lines high causes node D0 from AND gate 1022 to rise (arrow 1040) and the clear node CLR0 of flip-flop 1026 to fall (arrow 1042). AND gate 1024 then passes the rising edge on node D0 via a line EDGE to latch stage 1012 (arrow 1044).

The rising edge on line EDGE clocks latch 1030. The output Q1 of latch 1030 rises in response to the clock (arrow 1046) because input D1 is tied high. The rising edge clocks flip-flop 1026, causing output terminal Q0 to rise (arrow 1048). This, in turn, causes the signal on line EDGE to return to a logic zero (arrows 1050 and 1052). The rising edge on output terminal Q1 also clocks downstream latch stage 1013 so that output terminal Q2 rises (arrow 1054) after the clock-to-out delay of latch stage 1013.

Each latch stage 1012–1019 is similarly configured, so that latch stages 1013 and 1014 each propagate the rising edge as did latch stage 1012 (arrows 1054 and 1056). When the rising edge propagates through to output Q3, AND gate 1032 of latch stage 1012 passes the rising edge to clear terminal CLR1 (arrow 1058) to clear latch 1030 (arrow 1060). Clearing latch 1030 prepares latch 1030 to respond to a subsequent rising edge. The remaining latches in latch stages 1013–1019 are similarly cleared by downstream latch stages.

Each latch stage propagates the rising edge until the final output terminal Q8 rises (arrow 1062). The rising edge on terminal Q8 then causes another rising edge on line EDGE (arrows 1064 and 1066) and the cycle begins again.

Latch stages 1012–1019 continue to cycle the rising edge as long as both test enable terminals TE and TE1 remain high. As a result, the signal on line EDGE oscillates. The period of this oscillation, largely determined by the clock-to-Q delays of latch stages 1013–1019, can then be measured to find the clock-to-Q delays for the latches and associated circuitry. Measuring the period of an oscillating signal can be accomplished in many ways, as is well understood by those of skill in the art.

Figure 11A:
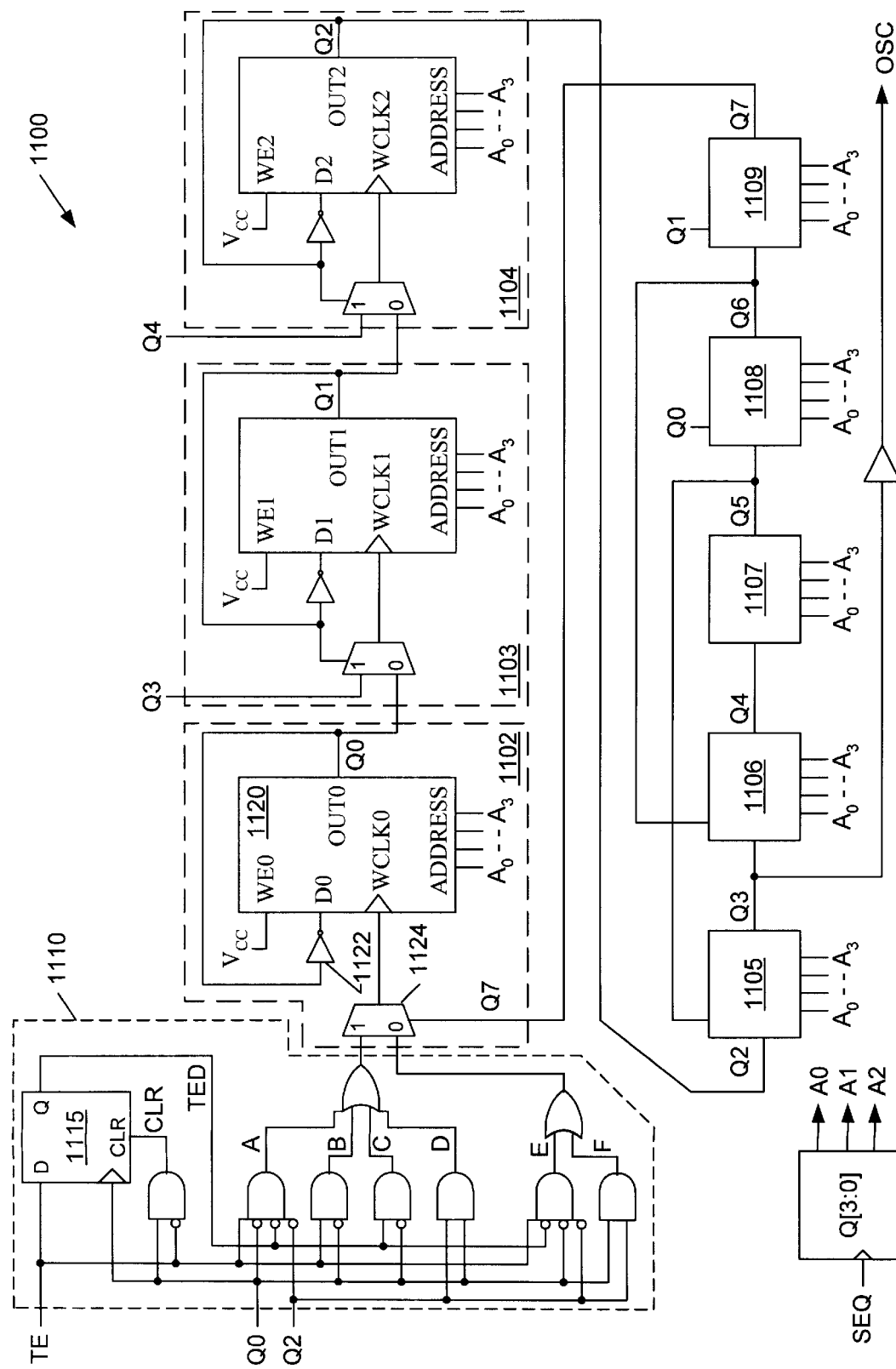
FIG. 11A depicts a ring oscillator 1100 configured to oscillate at a frequency determined by the write times of a number of RAM stages 1102–1109.

FIG. 11A depicts a ring oscillator 1100 configured to oscillate at a frequency determined, in large part, by the write times of a number of RAM stages 1102–1109 arranged in a ring. As with the other oscillators disclosed herein, oscillator 1100 includes an oscillator-enable circuit 1110 that induces the ring of RAM stages to oscillate. Oscillator-enable circuit 1110 includes seven AND gates, two OR gates, and a D flip-flop 1115. Oscillation-enable circuit 1110 is not optimized to minimize logic complexity, but is advantageously configured for efficient use of FPGA resources. A key difference between oscillator 1100 and oscillator 900 of FIG. 9A is that the period of oscillator 900 depends upon the delays associated with writing both ones and zeroes into RAM, whereas the period of oscillator 1100 does not depend upon the delay associated with writing logic zeros. The operation of oscillator-enable circuit 1110 is explained below in connection with FIG. 11B.

The following discussion focuses on the detailed operation of a single RAM stage 1102. The remaining RAM stages 1103–1109 are identical. RAM stage 1102 includes a RAM cell 1120, an inverter 1122, and a multiplexer 1124. Each address line A0–A3 connects, via an address bus, to a sequencer 1130. Sequencer 1130 allows a tester to test the write delays associated with particular addresses within the RAM cells of RAM stages 1102–1109.

Figure 11B:
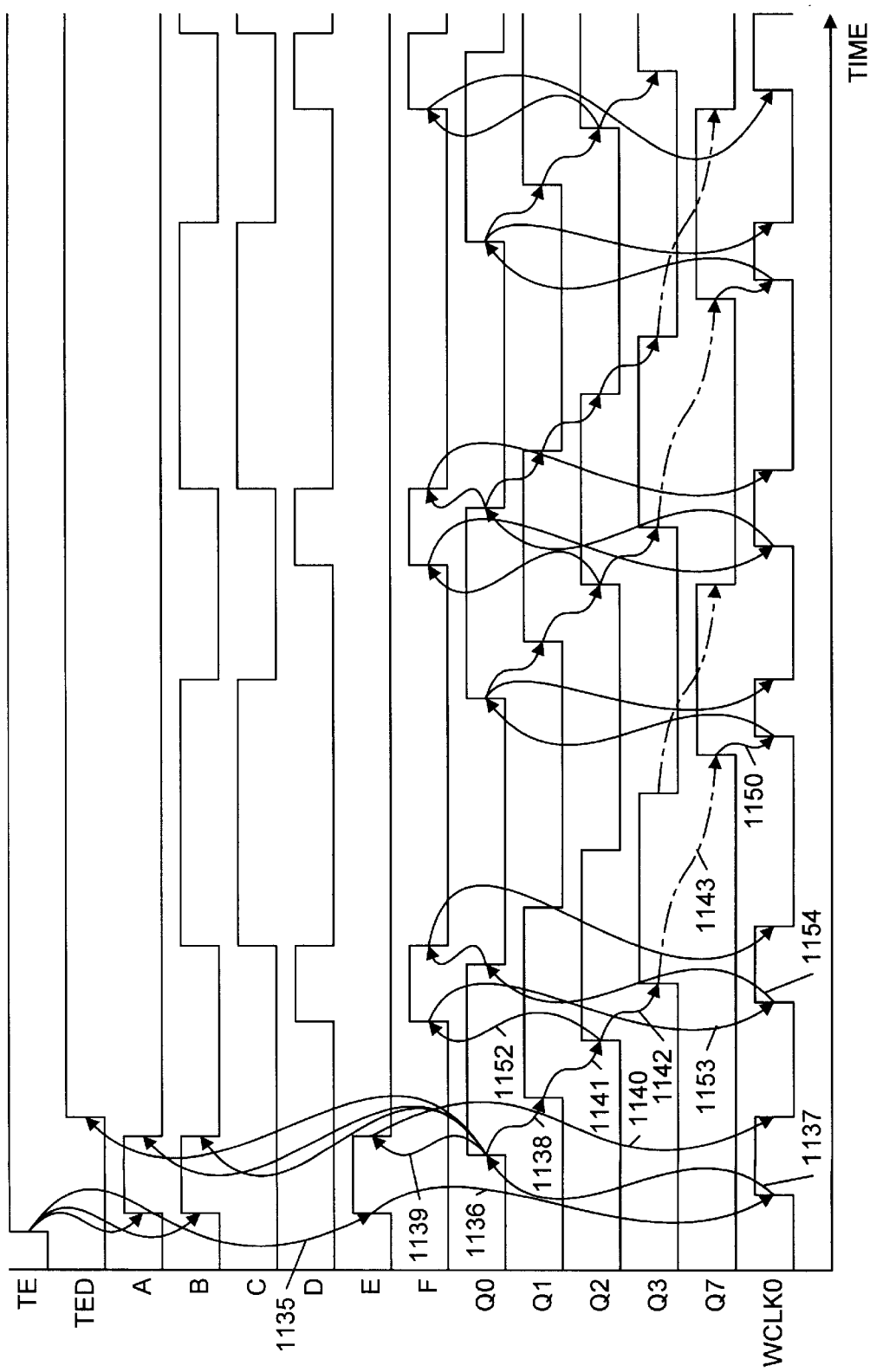
FIG. 11B is a waveform diagram depicting the operation of oscillator 1100 of FIG. 11A.

FIG. 11B is a waveform diagram depicting the operation of oscillator 1100 of FIG. 11A. Raising test-enable terminal TE to a logic one provides the initial rising edge on write-clock line WCLK0 of RAM cell 1120 (arrows 1135 and 1136). Clocking RAM cell 1120 causes RAM cell 1120 to write a logic one (the level on input terminal D0) into the selected address location and output the logic one on output terminal Q0 (arrow 1137). The rising edge on terminal Q0 clocks the subsequent RAM stage 1103, causing the level on output terminal Q1 to go high (arrow 1138) and the clock signal on line WCLK0 to return to a logic zero (arrows 1139 and 1140). Returning the clock line to a logic zero prepares RAM stage 1102 to clock on a subsequent rising edge. (The rising edge on terminal Q0 also causes the signals on nodes A and B to fall. Nodes A, B, C, and D and the associated logic are configured to ensure that the RAM cells return to a desired state when test-enable terminal TE is returned to a logic zero.)

From terminal Q0, the rising edge propagates through each subsequent RAM element until output terminal Q7 goes high (arrows 1141, 1142, and 1143). The rising edge on terminal Q7 then raises the logic level on write-clock line WCLK0 (arrow 1150) and the cycle begins again.

Oscillator 1100 is configured to measure the delays associated with writing logic ones; the period of the test signal is independent of write delays associated with logic zeros. To accomplish this, each RAM cell must contain a logic zero before the next rising edge appears on the respective clock terminals. Each RAM stage is therefore configured to write a logic zero into the corresponding RAM cell before the next rising edge propagates through the other RAM stages. For example, multiplexer 1124 gates the output Q2 of RAM stage 1104 to write-clock terminal WCLK0 when output terminal Q0 is high. Thus, when the propagating rising edge causes output Q2 of RAM stage 1104 to rise, the rising edge clocks RAM cell 1120, causing the output Q0 to fall (arrows 1152, 1153, and 1154). The remaining RAM stages are similarly configured to output logic zeros when downstream RAM stages are set.

The waveforms on each of output nodes Q0–Q7 are substantially the same. The output of oscillator 1100 is taken from output node Q3 through a conventional buffer. The period of each Q output signal is determined, in large part, by the cumulative write delays of each RAM stage 1102–1109.

Oscillator 1100 is configured to model write delays for RAM cells that write logic ones on rising clock edges. A similar circuit can be configured to model write delays for RAM cells that write on falling clock edges. For example, in one such embodiment that includes negative-edge-triggered RAM cells the output of each multiplexer preceding a RAM cell is inverted. In another embodiment, oscillator 1100 is modified to model write delays associated with writing logic zeros into RAM cells. This may be accomplished, for example, by initializing each RAM cell to store a logic one and inverting each destination of output lines Q0–Q7 except for the inverters driving the RAM data inputs (e.g., D0–D2).

Figure 12:
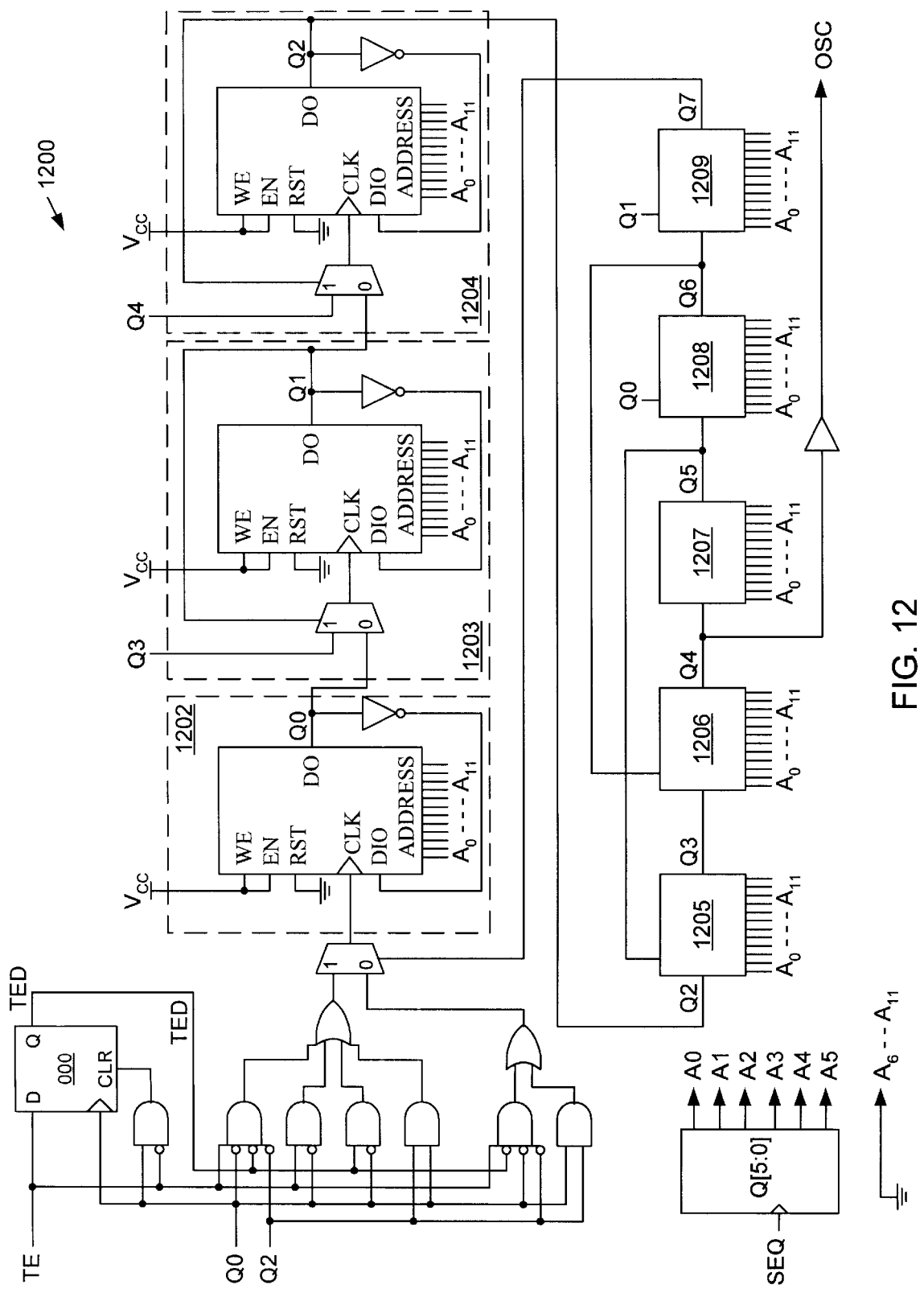
FIG. 12 depicts a ring oscillator 1100 configured to oscillate at a frequency determined by the write delays of a number of RAM stages 1202–1209.

FIG. 12 depicts a ring oscillator 1200 configured to oscillate at a frequency determined, in large part, by the write delays of a number of RAM stages 1202–1209. RAM stages 1202–1209 are similar to RAM stages 1102–1109 of FIG. 11A. However, RAM stages 1202–1209 are of a type that is synchronously read and written. Due to the similarities of oscillators 1100 and 1200, a detailed discussion of the workings of oscillator 1200 is omitted for brevity.

Figure 13:
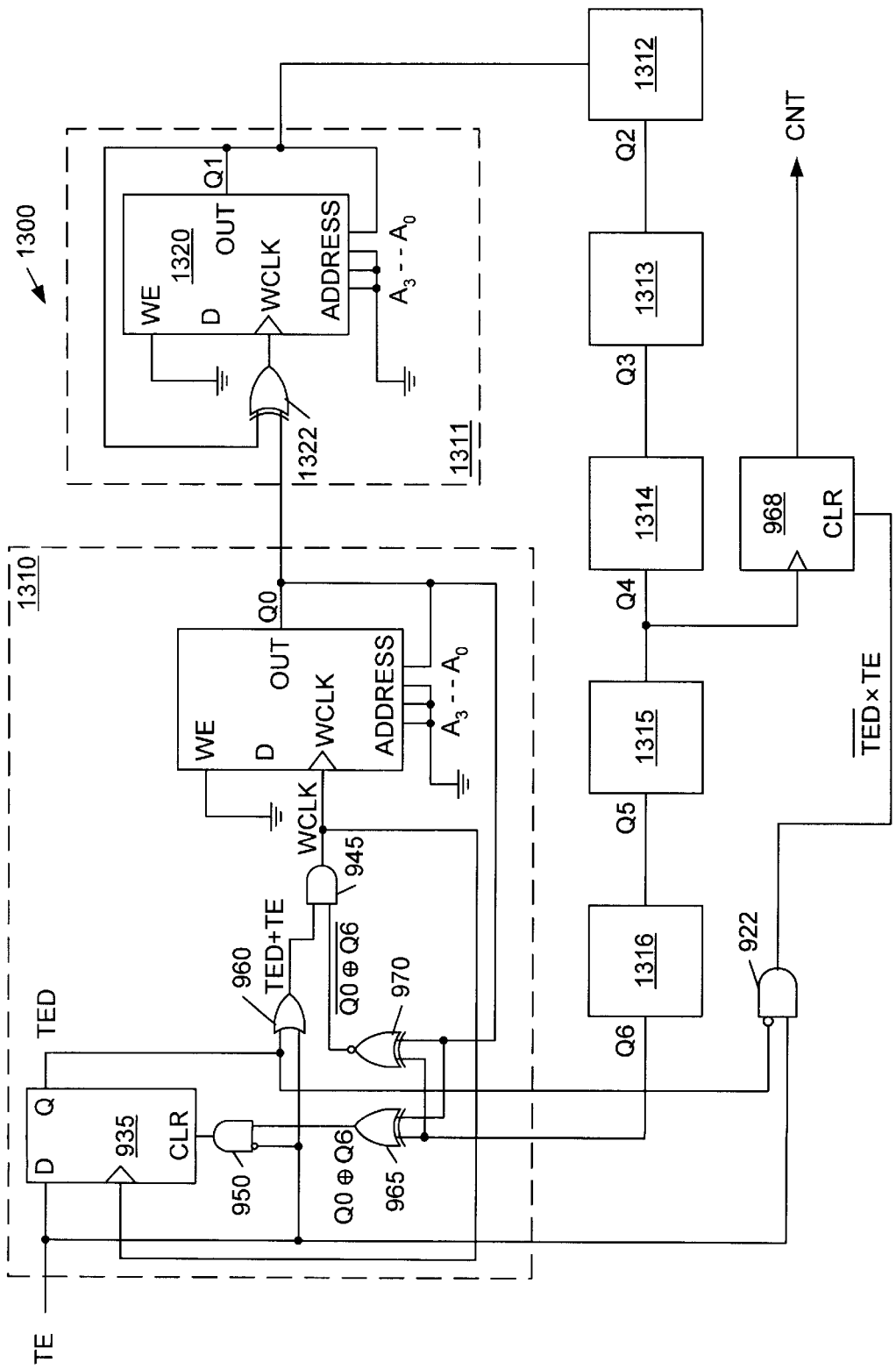
FIG. 13 depicts an oscillator 1300 for which the oscillation period is a function of the read delays of a number of RAM cells.

FIG. 13 depicts an oscillator 1300 for which the oscillation period is a function of the read delays of a number of RAM cells. Oscillator 1300 is similar to oscillator 900 of FIG. 9A, like-numbered elements being the same. Oscillator 1300 differs from oscillator 900 in that each RAM cell in oscillator 1300 is configured to read synchronous with a clock signal instead of write, and oscillator 1300 oscillates at a frequency determined by the delays associated with those reads.

Oscillator 1300 includes an oscillation-enable circuit 1310 and six identical RAM stages 1311–1316. Each RAM cell in oscillator-enable circuit 1310 and RAM stages 1311–1316 is identically configured. The following discussion is therefore limited to RAM stage 1311.

RAM stage 1311 includes a RAM cell 1320 and an XOR gate 1322. The first address line A0 is tied to output terminal Q1, the remaining address lines A1–A3 are tied to ground. Thus, address 0000 is selected while RAM cell 1320 outputs a logic zero, and address 0001 is selected while RAM cell 1320 outputs a logic one.

A logic zero is written into each RAM cell at address 0001 and a logic one is written into each RAM cell at address 0000 before activating oscillator 1300. The outputs of each RAM will therefore transition for each rising edge on their respective clock terminals. Oscillator 1300 functions as described above in connection with FIG. 9B. The period of oscillation depends, in large part, on the read delays of the RAM cells of oscillator 1300.

Figure 14:
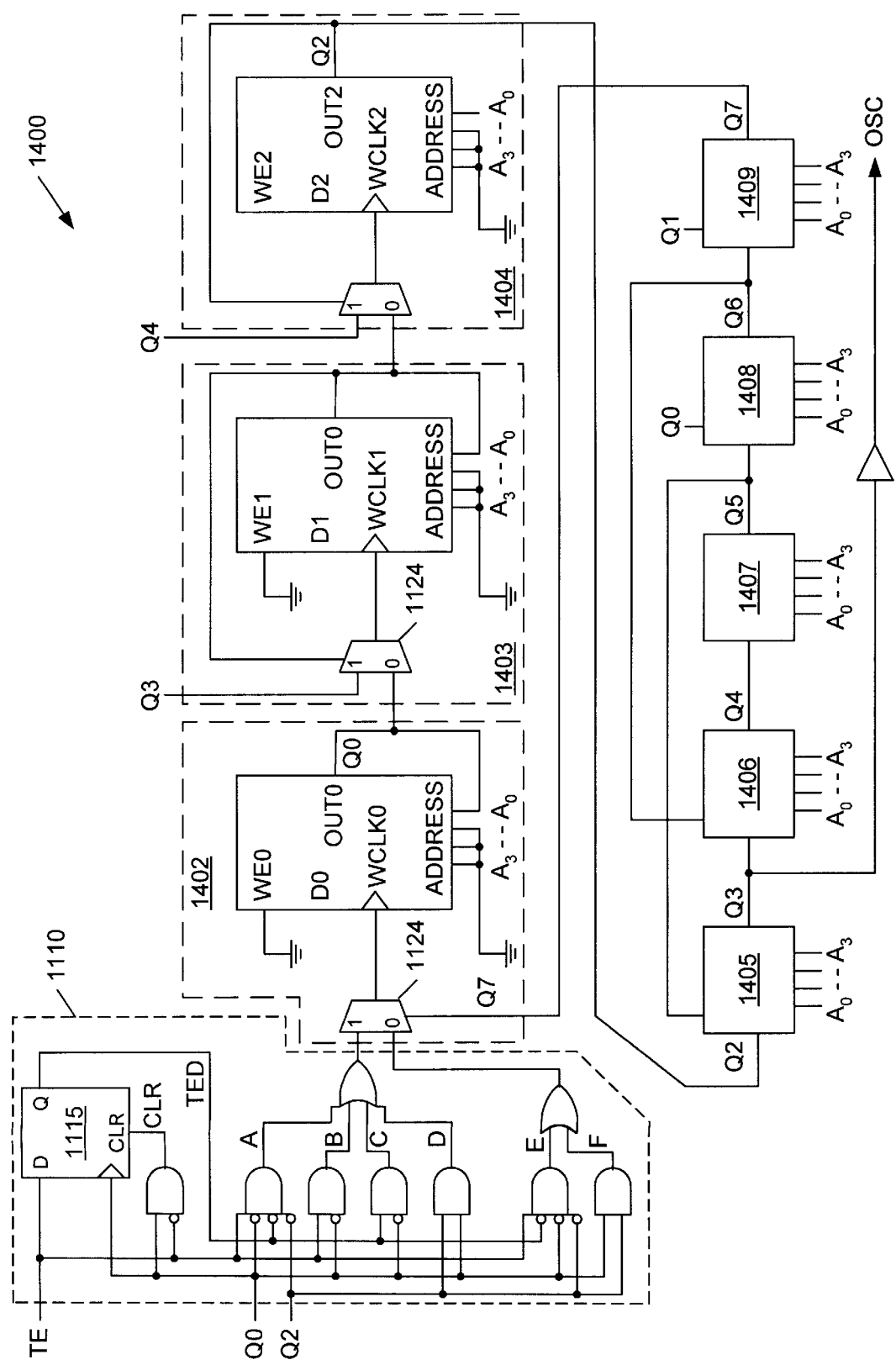
FIG. 14 depicts an oscillator 1400 that employs a RAM element similar to RAM element 1300 to separately model reading logic ones and logic zeros.

The period of oscillator 1300 includes delays associated with reading both ones and zeros. FIG. 14 depicts an oscillator 1400 that can be used to separately model the reading of logic ones from RAM cells. Oscillator 1400 is similar to oscillator 1100, like numbered elements being the same. The waveforms of oscillators 1400 and 1100 are also similar. A detailed discussion of oscillator 1400 is therefore omitted for brevity.

Oscillator 1400 includes eight RAM elements 1402–1409, each including a RAM cell. As in FIG. 13, a logic one is written to address 0000 and a logic zero is written to address 0001 of each RAM cell. Each RAM cell is then preset to address 0001. Asserting test-enable signal TE will then cause oscillator 1400 to oscillate as described above in connection with FIGS. 11A and 11B.

The timing of each of the foregoing delay elements and oscillators depends on the delay of interest for the selected type of memory cell and also upon the related interconnect and logic. Accurately determining the delay of interest is therefore somewhat more complex than simply dividing a given delay by the number of memory elements in the delay path. There are generally two approaches. The first, outlined above in connection with FIG. 7, compares the timing of a delay circuit or oscillator that includes a memory cell (or other element) of interest with a nearly identical circuit without the memory cell. The delay difference between the two circuits is then presumed to be the contribution of the memory cell. The second approach assigns each circuit element, or "primitive," in a number of different circuit configurations a different timing variable. The clock-to-Q delay of a particular memory element might be assigned one variable, while a certain buffer might be assigned another, for example. A series of equations can then be created by combining the delays associated with the various primitives in the different circuit configurations. The equations are then solved and the results compared with the measured timing values for the circuits that the equations are intended to simulate. Then, in a process commonly known as modeling of data, well-known mathematical principles are used to adjust the assigned timing variables for the various primitives to minimize the difference between actual measured data and simulated data gathered using the assigned variables.

All of the circuits described in connection with FIGS. 2 through 14 can be implemented in programmable logic devices, such as one of the XC4000 series of FPGAs available from Xilinx, Inc., of San Jose, Calif. Devices, software, and methods used to accomplish general logic implementations are commercially available from Xilinx, Inc., and are well known to those of skill in the art. See, for example, "The Programmable Logic Data Book," (1998) pp. 4–5 to 4–40, available from Xilinx, Inc., which are incorporated herein by reference.

While the present invention has been described in connection with specific embodiments, variations of these embodiments will be obvious to those of ordinary skill in the art. For example, the various examples include four synchronous components, but the invention is not so limited. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Therefore, the spirit and scope of the appended claims should not be limited to the foregoing description.

What is claimed is:

1. An oscillator comprising a plurality of memory cells, each memory cell having:
   a. a clock terminal;
   b. a synchronous input terminal;
   c. an output terminal; and
   d. a node connecting the output terminal to the clock terminal of a downstream memory cell.
2. The oscillator of claim 1, wherein the memory cell is a RAM cell.

3. The oscillator of claim 1, wherein the memory cell is a latch.

4. The oscillator of claim 1, further comprising an oscillation-enable circuit disposed between the input terminal of a first one of the plurality of memory cells and the output terminal of a second one of the plurality of memory cells, wherein the oscillation-enable circuit is adapted to initiate oscillation.

5. The oscillator of claim 4, wherein the oscillation-enable circuit comprises:
  a. an enable flip-flop having a clock terminal, a synchronous input terminal, an asynchronous input terminal, and an output terminal; and
  b. a logic circuit receiving a test-enable signal, an output signal from the enable flip-flop output terminal, and a signal from the second memory cell and applying a logic circuit output signal to the clock terminal of the first memory cell.

6. The oscillator of claim 5 wherein the oscillation-enable circuit further comprises a node connecting the test-enable signal to the asynchronous input terminal of the enable flip-flop.

7. The oscillator of claim 5 wherein the logic circuit comprises
  a logic gate receiving the test-enable signal and providing the logic circuit output signal to the clock terminal of the downstream memory cell.

8. The oscillator of claim 1, wherein the output terminal of each memory cell connects to the synchronous input terminal of the respective memory cell via an inverter.

9. The oscillator of claim 1, wherein the output terminal of at least one memory cell connects to the clock terminal of the at least one memory cell.

10. The oscillator of claim 1, further comprising a logic gate having an output terminal connected to the clock terminal of the downstream memory cell, wherein the output terminal of the downstream memory cell connects to the clock terminal of the downstream memory cell via the logic gate, and wherein the output terminal of a memory cell upstream from the downstream memory cell connects to the clock terminal of the downstream memory cell via the logic gate.

11. The oscillator of claim 1, wherein each memory cell includes a second input terminal adapted to place the memory cell in a predetermined memory state, and wherein the output terminal of each memory cell connects to the respective second input terminal.

12. The oscillator of claim 11, wherein the second input terminal is a clear terminal.

13. The oscillator of claim 11, wherein the oscillator further comprises a second downstream memory cell downstream from the first-mentioned downstream memory cell and a third downstream memory cell downstream from the first and second downstream memory cells, and wherein the output terminal of the third downstream memory cell connects to the second input terminal of the first downstream memory cell.

14. The oscillator of claim 1, further comprising a multiplexer having an output terminal connected to the clock terminal of the downstream memory cell.

15. The oscillator of claim 1, each memory cell further comprising a plurality of address terminals, wherein the output terminal of each memory cell connects to at least one of the address terminals.

16. A delay circuit comprising:
  a. a first memory cell having:
    i. a first clock terminal;
    ii. a first synchronous input terminal;
    iii. a first asynchronous input terminal; and
    iv. a first output terminal connected to the first clock terminal; and
  b. a second memory cell having a second clock terminal connected to the first output terminal of the first memory cell.

17. The delay circuit of claim 16, wherein the second memory cell further comprises a second output terminal connected to the first clock terminal of the first memory cell.

18. The delay circuit of claim 16, wherein the second memory cell further comprises a second output terminal, the delay circuit further comprising a feedback circuit connected between the second output terminal and at least one of the first synchronous terminal and the first asynchronous input terminal of the first memory cell, the feedback circuit adapted to propagate a signal through the delay circuit.

19. A system for determining an average signal delay for a plurality of memory cells, each memory cell having a clock terminal, a synchronous input terminal, and an output terminal, the system comprising:
  a. an interconnect network connecting the memory cells in a loop, wherein the output terminal of each memory cell connects to the clock terminal of a subsequent memory cell in the loop;
  b. an oscillator-enable circuit connected within the loop between the output terminal of a first memory cell in the loop and the clock terminal of a second memory cell in the loop, the oscillator-enable circuit adapted to propagate an oscillating signal through the loop, wherein the oscillating signal has a period determined by the average write delay of the memory cells in the loop; and
  c. means, connected to the loop, for measuring the period of the oscillating signal.

20. The system of claim 19, wherein the means for measuring the period of the oscillating signal comprises a counter.

21. A method for measuring an average signal propagation delay for a plurality of memory elements, each memory element having an input terminal and an output terminal, the method comprising:
  a. connecting the memory elements in series, such that each memory-element output terminal is connected to the memory-element input terminal of a downstream memory element, to form a test circuit having a test-circuit input terminal and a test-circuit output terminal, wherein the test circuit is configured such that each memory element changes from a first memory state to a second memory state upon receiving a signal transition on the respective memory-element input terminal;
  b. presetting each memory element to the first memory state;
  c. providing a first signal transition on a first memory-element input terminal in the test circuit, the first signal transition changing the memory state of a first one of the memory elements from the first state to the second state, thereby providing a second signal transition from the memory-element output terminal of the first memory-element to a second memory-element input terminal of a second one of the memory-elements in the test circuit;
  d. receiving an output signal transition on the output terminal of the test circuit in response to the first signal transition on the first memory-element input terminal, wherein the output signal transition is delayed from the first signal transition by the signal propagation delay; and e. measuring the signal propagation delay.

22. A test circuit for measuring an average signal propagation delay for a plurality of memory elements, each memory element having an input terminal and an output terminal, the test circuit comprising:

a. means for presetting each memory element to a first memory state;

b. means for providing a first signal transition on a first memory-element input terminal in the test circuit, the first signal transition changing the memory state of a first one of the memory-elements from the first state to a second state, thereby providing a second signal transition from the memory-element output terminal of the first memory-element to the memory-element input terminal of a second one of the memory elements in the test circuit;

c. means for receiving an output signal transition on an output node of the test circuit in response to the first signal transition on the first memory-element input terminal, wherein the output signal transition is delayed from the first signal transition by the signal propagation delay; and d. means for measuring the signal propagation delay.

\* \* \* \* \*